(12) United States Patent
Wang et al.

(10) Patent No.: US 11,941,217 B2
(45) Date of Patent: Mar. 26, 2024

(54) TOUCH CONTROL STRUCTURE, DISPLAY PANEL, DISPLAY APPARATUS, AND METHOD OF FABRICATING TOUCH CONTROL STRUCTURE

(71) Applicants: Chengdu BOE Optoelectronics Technology Co., Ltd., Sichuan (CN); BOE Technology Group Co., Ltd., Beijing (CN)

(72) Inventors: Wei Wang, Beijing (CN); Yi Zhang, Beijing (CN); Yuanqi Zhang, Beijing (CN); Yang Zeng, Beijing (CN); Yu Wang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/336,120

(22) Filed: Jun. 16, 2023

(65) Prior Publication Data
US 2023/0333699 A1 Oct. 19, 2023

Related U.S. Application Data

(63) Continuation of application No. 17/299,298, filed as application No. PCT/CN2020/107309 on Aug. 6, 2020, now Pat. No. 11,720,215.

(51) Int. Cl.
*G06F 3/044* (2006.01)
(52) U.S. Cl.
CPC .......... *G06F 3/0446* (2019.05); *G06F 3/0445* (2019.05); *G06F 2203/04111* (2013.01); *G06F 2203/04112* (2013.01)

(58) Field of Classification Search
CPC .... G06F 3/0412; G06F 3/0448; G06F 3/0445; G06F 3/0446; G06F 3/0443;
(Continued)

(56) References Cited

U.S. PATENT DOCUMENTS

2017/0205918 A1 7/2017 Kim et al.
2018/0299999 A1 10/2018 Jeong et al.
(Continued)

FOREIGN PATENT DOCUMENTS

CN 102646004 A 8/2012
CN 107885389 A 4/2018
(Continued)

OTHER PUBLICATIONS

International Search Report & Written Opinion dated Apr. 29, 2021, regarding PCT/CN2020/107309.
(Continued)

*Primary Examiner* — Deeprose Subedi
(74) *Attorney, Agent, or Firm* — Intellectual Valley Law, P.C.

(57) ABSTRACT

A touch control structure is provided. The touch control structure includes a plurality of first touch electrodes arranged in a plurality of rows and a plurality of second touch electrodes arranged in a plurality of columns. The plurality of rows of the plurality of first touch electrodes respectively extend to a first edge of the touch control structure. A respective one of a plurality of edge-adjacent electrode blocks directly adjacent to multiple first edge electrode blocks respectively from a plurality of rows of the plurality of first touch electrodes includes a truncated protrusion. An edge of the truncated protrusion is spaced apart from the first edge by a gap. An area of the truncated protrusion is less than an area of a respective non-truncated protrusion of the multiple non-truncated protrusions.

20 Claims, 24 Drawing Sheets

(58) Field of Classification Search
CPC . G06F 2203/04103; G06F 2203/04111; G06F 2203/04112; H10K 59/40
See application file for complete search history.

(56) References Cited

U.S. PATENT DOCUMENTS

| | | |
|---|---|---|
| 2019/0171318 A1 | 6/2019 | Ryu et al. |
| 2019/0294284 A1 | 9/2019 | Akimoto et al. |
| 2021/0141491 A1* | 5/2021 | Gogte ................... G06F 3/0446 |

FOREIGN PATENT DOCUMENTS

| | | |
|---|---|---|
| CN | 108509093 A | 9/2018 |
| CN | 109062461 A | 12/2018 |

OTHER PUBLICATIONS

Notice of Allowance in U.S. Appl. No. 17/299,298, dated Apr. 26, 2023.

* cited by examiner

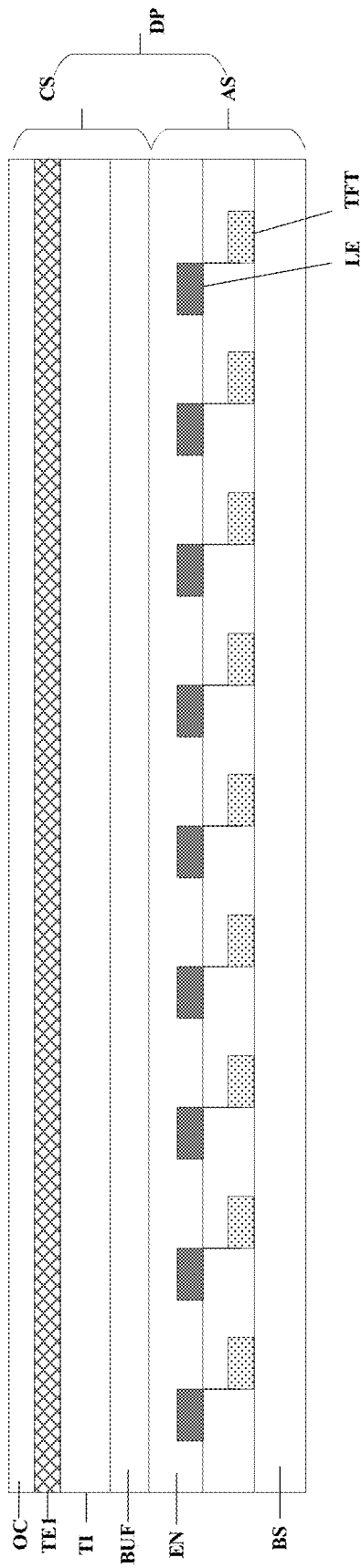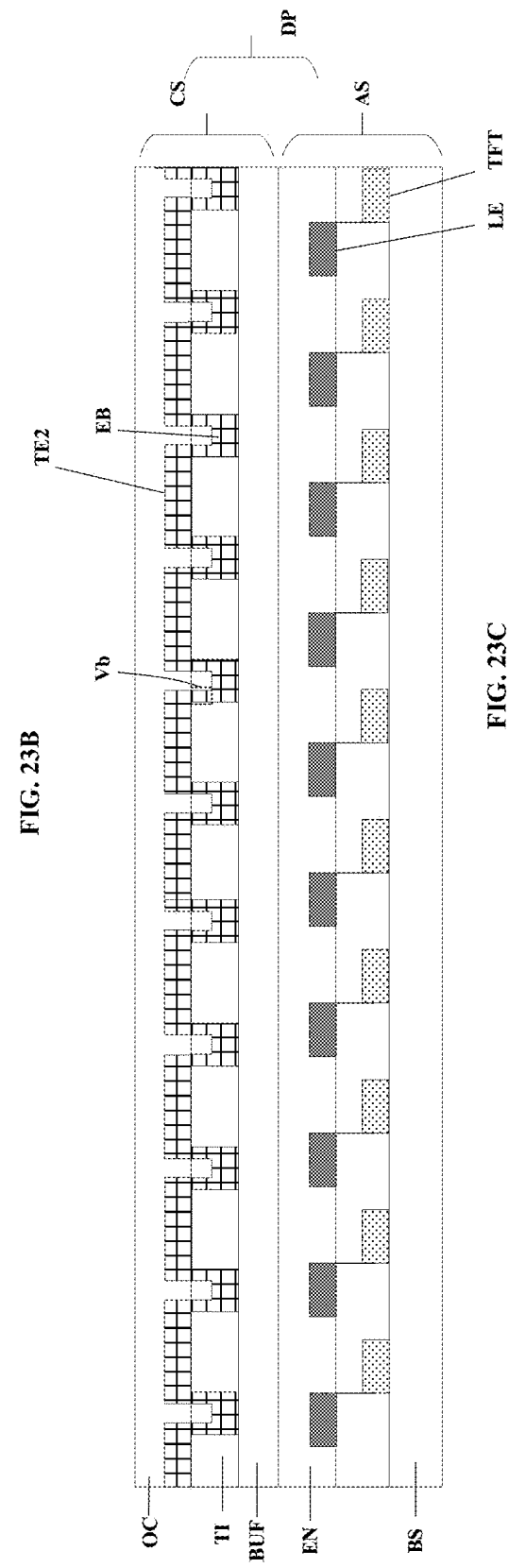

TOUCH CONTROL STRUCTURE, DISPLAY PANEL, DISPLAY APPARATUS, AND METHOD OF FABRICATING TOUCH CONTROL STRUCTURE

CROSS-REFERENCE TO RELATED APPLICATION

This application is a continuation-in-part of U.S. application Ser. No. 17/299,298, filed Aug. 6, 2020, which is a national stage application under 35 U.S.C. § 371 of International Application No. PCT/CN2020/107309, filed Aug. 6, 2020. Each of the forgoing applications is herein incorporated by reference in its entirety for all purposes.

TECHNICAL FIELD

The present invention relates to display technology, more particularly, to a touch control structure, a display panel, a display apparatus, and a method of fabricating a touch control structure.

BACKGROUND

Various types of touch panels have been developed. Examples of touch panels include one-glass-solution (OGS) touch panels, on-cell touch panels, and in-cell touch panels. The on-cell touch panels provide high touch control accuracy. The on-cell touch panels can be classified into single-layer-on-cell (SLOC) touch panels and multi-layer-on-cell (MLOC) touch panels. In particular, multiple point touch control can be achieved in the MLOC touch panels with superior touch control accuracy and blanking effects.

SUMMARY

In one aspect, the present disclosure provides a touch control structure, comprising a plurality of first touch electrodes arranged in a plurality of rows and a plurality of second touch electrodes arranged in a plurality of columns; wherein the plurality of rows of the plurality of first touch electrodes respectively extend to a first edge of the touch control structure; a respective row of the plurality of rows comprises a plurality of non-edge first electrode blocks and a first edge electrode block, the first edge electrode block being along the first edge; the plurality of non-edge first electrode blocks have a same shape; electrode blocks of the plurality of first touch electrodes and the plurality of second touch electrodes are in a same layer, and respectively comprises a main portion and protrusion portions; the plurality of column of the plurality of second touch electrodes comprise a plurality of non-edge columns and an edge-adjacent column, the edge-adjacent column being directly adjacent to multiple first edge electrode blocks respectively from the plurality of rows of the plurality of first touch electrodes; the edge-adjacent column comprises a plurality of edge-adjacent electrode blocks electrically connected; a respective one of the plurality of edge-adjacent electrode blocks comprises a truncated protrusion, and multiple non-truncated protrusions; an edge of the truncated protrusion is spaced apart from the first edge by a gap; a gap part of the first edge electrode block is in the gap; the truncated protrusion extends from a respective main portion of the respective one of the plurality of edge-adjacent electrode blocks along a first direction; and an area of the truncated protrusion is less than an area of a respective non-truncated protrusion of the multiple non-truncated protrusions.

Optionally, an average width of the truncated protrusion along a direction perpendicular to the first direction is less than an average width of the respective non-truncated protrusion along the direction perpendicular to the first direction.

Optionally, a length of the truncated protrusion along the first direction is less than a length of the respective non-truncated protrusion along the first direction.

Optionally, a width along a direction perpendicular to the first direction of at least a portion of the truncated protrusion gradually decrease along the first direction.

Optionally, the truncated protrusion has a first side and a second side; the second side is closer to the first edge than the first side; the first side extends along the first direction; the first side and the second side cross over each other, forming an included angle less than 90 degrees; and a distance between the first side and the second side gradually decreases along the first direction.

Optionally, the second side is a curved side having a first terminal and a second terminal; the second terminal connects with a terminal of the first side; a distance along the first direction between the first terminal and a boundary between the truncated protrusion and the respective main portion is 30% to 70% of a length of the truncated protrusion along the first direction.

Optionally, the curved side has a quasi-arch shape.

Optionally, the curved side has an undulating shape.

Optionally, the electrode blocks of the plurality of first touch electrodes and the plurality of second touch electrodes are respectively hexagonal mesh electrode blocks; a respective first electrode block and a respective second electrode block adjacent to each other are insulated from each other by line breaks in mesh lines; the first side and the second side are respectively formed by virtually connected line breaks of the truncated protrusion.

Optionally, a respective one of the line breaks is a break in middle of a mesh line.

Optionally, the gap part in the gap comprises at least one mesh along a row direction.

Optionally, the at least one mesh comprises a hexagonal mesh.

Optionally, the first edge electrode block comprises a first main edge portion and a first side edge portion respectively along the first edge; and the gap part of the first side edge portion in the gap is between the first main edge portion and an edge protrusion of the first edge electrode block, and electrically connected to the first main edge portion and the edge protrusion of the first edge electrode block.

Optionally, second electrode blocks of the plurality of non-edge columns and first electrode blocks other than the multiple first edge electrode blocks respectively from the plurality of rows of the plurality of first touch electrodes have a substantially same shape and dimension; and the average width of the truncated protrusion is less than an average width of any one of protrusions in the second electrode blocks of the plurality of non-edge columns or in the first electrode blocks other than the multiple first edge electrode blocks respectively from the plurality of rows of the plurality of first touch electrodes.

Optionally, the touch control structure further comprises a plurality of touch electrode bridges and an insulating layer between the plurality of touch electrode bridges, and the electrode blocks of the plurality of first touch electrodes and the plurality of second touch electrodes; the plurality of touch electrode bridges respectively extend through vias in the insulating layer to respectively connect adjacent second electrode blocks in a respective column of the plurality of columns of the plurality of second touch electrodes.

Optionally, a respective one of plurality of non-edge first electrode blocks comprises a first main portion and a first side portion respectively along a first virtual line parallel to the first edge; along the first virtual line, boundaries of the first main portion and the first side portion are disconnected from each other; the first edge electrode block comprises a first main edge portion and a first side edge portion respectively along the first edge; the first main edge portion and the first side edge portion are directly physically connected to each other; the first main edge portion and the first main portion have a same shape; external electrode edges of the first main edge portion other than a portion along the first edge are identical to external electrode edges of the first main portion; and the first side edge portion and the first side portion have at least partially different shapes and at least partially different external contours.

Optionally, the first side edge portion comprises a first outer sub-portion and a first bridge sub-portion respectively along the first edge, the first bridge sub-portion directly physically connecting the first outer sub-portion to the first main edge portion; the first side portion comprises a first sub-portion and a second sub-portion along the first virtual line; external electrode edges of the first outer sub-portion other than a portion along the first edge are identical to external electrode edges of the first sub-portion; the first sub-portion and the first outer sub-portion have a same shape; the first bridge sub-portion and the second sub-portion have different shapes and different external contours; and along the first virtual line, boundaries of the second sub-portion and the first main portion are disconnected from each other.

Optionally, the first main portion and the first main edge portion have a first translational symmetry; the first outer sub-portion and the first sub-portion have a second translational symmetry; and the first translational symmetry and the second translational symmetry are the same.

Optionally, the first side portion is at least a portion of a protrusion of the respective one of plurality of non-edge first electrode blocks; and the first side edge portion is a protrusion of the first edge electrode block.

Optionally, the first edge electrode block further comprises a second side edge portion; the first side edge portion, the first main edge portion, and second side edge portion are sequentially arranged along the first edge; the respective one of plurality of non-edge first electrode blocks further comprises a second side portion; the first side portion, the first main portion, and the second side portion are sequentially arranged along the first virtual line; along the first virtual line, boundaries of the first main portion and the second side portion are disconnected from each other; the first main edge portion and the second side edge portion are directly physically connected to each other; and the second side edge portion and the second side portion have at least partially different shapes and at least partially different external contours.

Optionally, the second side edge portion comprises a second outer sub-portion and a second bridge sub-portion respectively along the first edge, the second bridge sub-portion directly physically connecting the second outer sub-portion to the first main edge portion; the second side portion comprises a third sub-portion and a fourth sub-portion along the first virtual line; external electrode edges of the second outer sub-portion other than a portion along the first edge are identical to external electrode edges of the third sub-portion; the third sub-portion and the second outer sub-portion have a same shape; the second bridge sub-portion and the fourth sub-portion have different shapes and different external contours; and along the first virtual line, boundaries of the fourth sub-portion and the first main portion are disconnected from each other.

Optionally, the first main portion and the first main edge portion have a first translational symmetry; the first outer sub-portion and the first sub-portion have a second translational symmetry; the second outer sub-portion and the third sub-portion have a third translational symmetry; and the first translational symmetry, the second translational symmetry, and the third translational symmetry are the same.

Optionally, the first side portion and the second side portion are respectively at least portions of protrusions of the respective one of plurality of non-edge first electrode blocks; and the first side edge portion and the second side edge portion are respectively protrusions of the first edge electrode block.

Optionally, each of the multiple first edge electrode blocks is along the first edge; a respective one of the plurality of non-edge columns comprises a plurality of non-edge second electrode blocks electrically connected; and external electrode edges of a respective one of the plurality of edge-adjacent electrode blocks are identical to external electrode edges of a respective one of the plurality of non-edge second electrode blocks except for a first portion directly adjacent to the first side edge portion in an adjacent row of the plurality of rows.

In another aspect, the present disclosure provides a display apparatus, comprising the touch control structure described herein or fabricated by a method described herein, a display panel, and an integrated circuit connected to the display panel.

BRIEF DESCRIPTION OF THE FIGURES

The following drawings are merely examples for illustrative purposes according to various disclosed embodiments and are not intended to limit the scope of the present invention.

FIG. 4 illustrates boundaries of respective portions of electrodes in

FIG. 3.

FIG. 23B is a cross-sectional view along an A-A' line in FIG. 23A.

FIG. 23C is a cross-sectional view along a B-B' line in FIG. 23A.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a touch control structure, a display panel, a display apparatus, and a method of fabricating a touch control structure that substantially obviate one or more of the problems due to limitations and disadvantages of the related art. In one aspect, the present disclosure provides a touch control structure. In some embodiments, the touch control structure includes a plurality of first touch electrodes arranged in a plurality of rows and a plurality of second touch electrodes arranged in a plurality of columns. In some embodiments, the plurality of rows of the plurality of first touch electrodes respectively extend to a first edge of the touch control structure. A respective row of the plurality of rows comprises a plurality of non-edge first electrode blocks and a first edge electrode block, the first edge electrode block being along the first edge. Optionally, the plurality of non-edge first electrode blocks have a same shape; the first edge electrode block comprises a first main edge portion and a first side edge portion respectively along the first edge. Optionally, a respective one of plurality of non-edge first electrode blocks comprises a first main portion and a first side portion respectively along a first virtual line parallel to the first edge. Optionally, along the first virtual line, boundaries of the first main portion and the first side portion are disconnected from each other. Optionally, the first main edge portion and the first side edge portion are directly physically connected to each other. Optionally, the first main edge portion and the first main portion have a same shape. Optionally, external electrode edges of the first main edge portion other than a portion along the first edge are identical to external electrode edges of the first main portion. Optionally, the first side edge portion and the first side portion have at least partially different shapes and at least partially different external contours.

Figure 1:
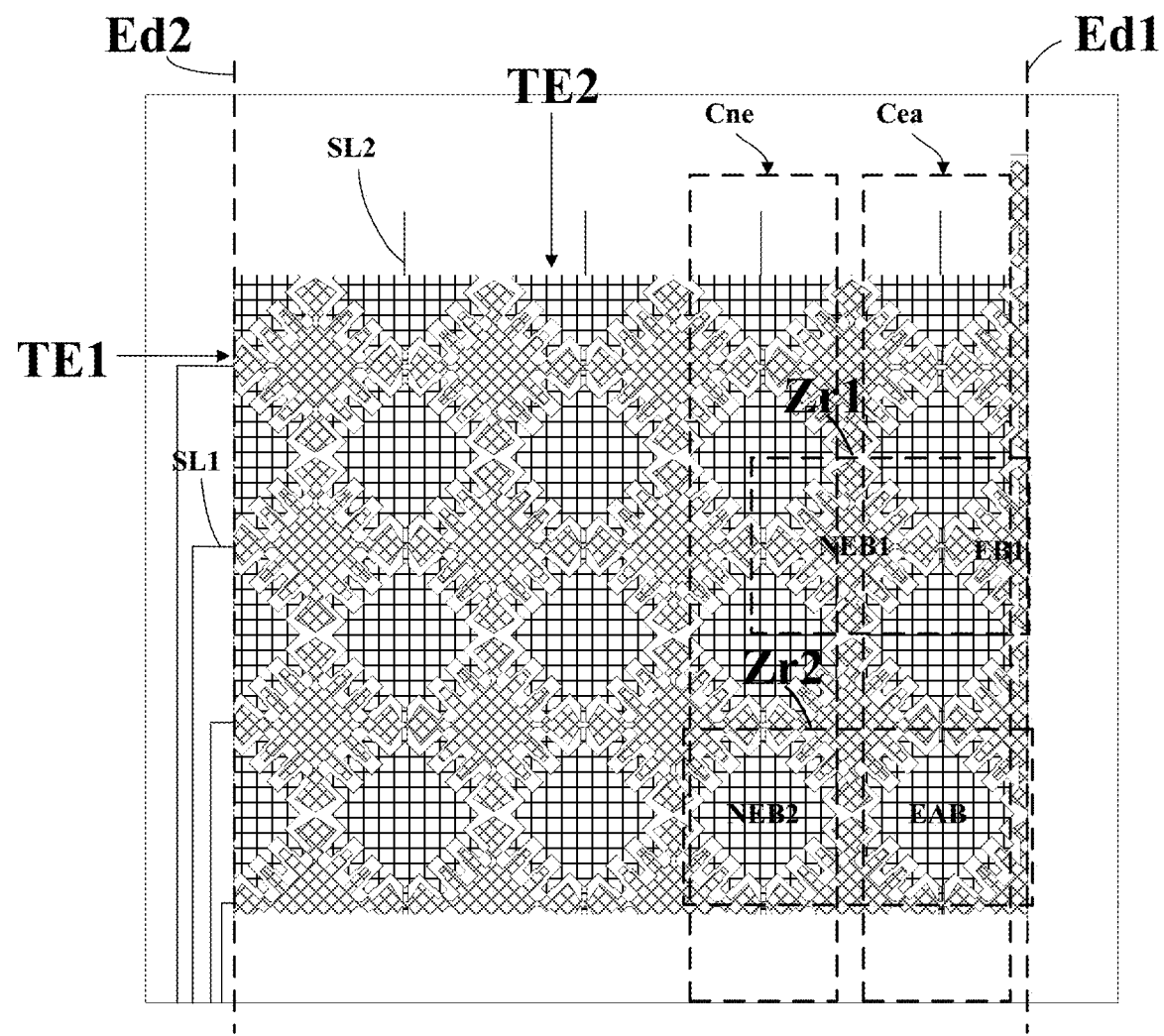
FIG. 1 is a schematic diagram illustrating the structure of a touch control structure in some embodiments according to the present disclosure.

FIG. 1 is a schematic diagram illustrating the structure of a touch control structure in some embodiments according to the present disclosure. Referring to FIG. 1, the touch control structure in some embodiments includes a plurality of first touch electrodes TE1 and a plurality of second touch electrodes TE2. The plurality of first touch electrodes TE1 are arranged in a plurality of rows, each of the plurality of rows is a respective one of the plurality of first touch electrodes TEL Adjacent rows of the plurality of rows are isolated from each other. The plurality of second touch electrodes TE2 arranged in a plurality of columns, each of the plurality of columns is a respective one of the plurality of second touch electrodes TE2. Adjacent columns of the plurality of columns are isolated from each other. Optionally, the touch control structure is a mutual capacitance type touch control structure. Optionally, the plurality of first touch electrodes TE1 are a plurality of touch scanning electrodes, and the plurality of second touch electrodes TE2 are a plurality of touch sensing electrodes. Optionally, the plurality of first touch electrodes TE1 are a plurality of touch sensing electrodes, and the plurality of second touch electrodes TE2 are a plurality of touch scanning electrodes. The touch electrodes of the touch control structure extend to a first edge Ed1, beyond which the touch control region ends.

Figure 2:
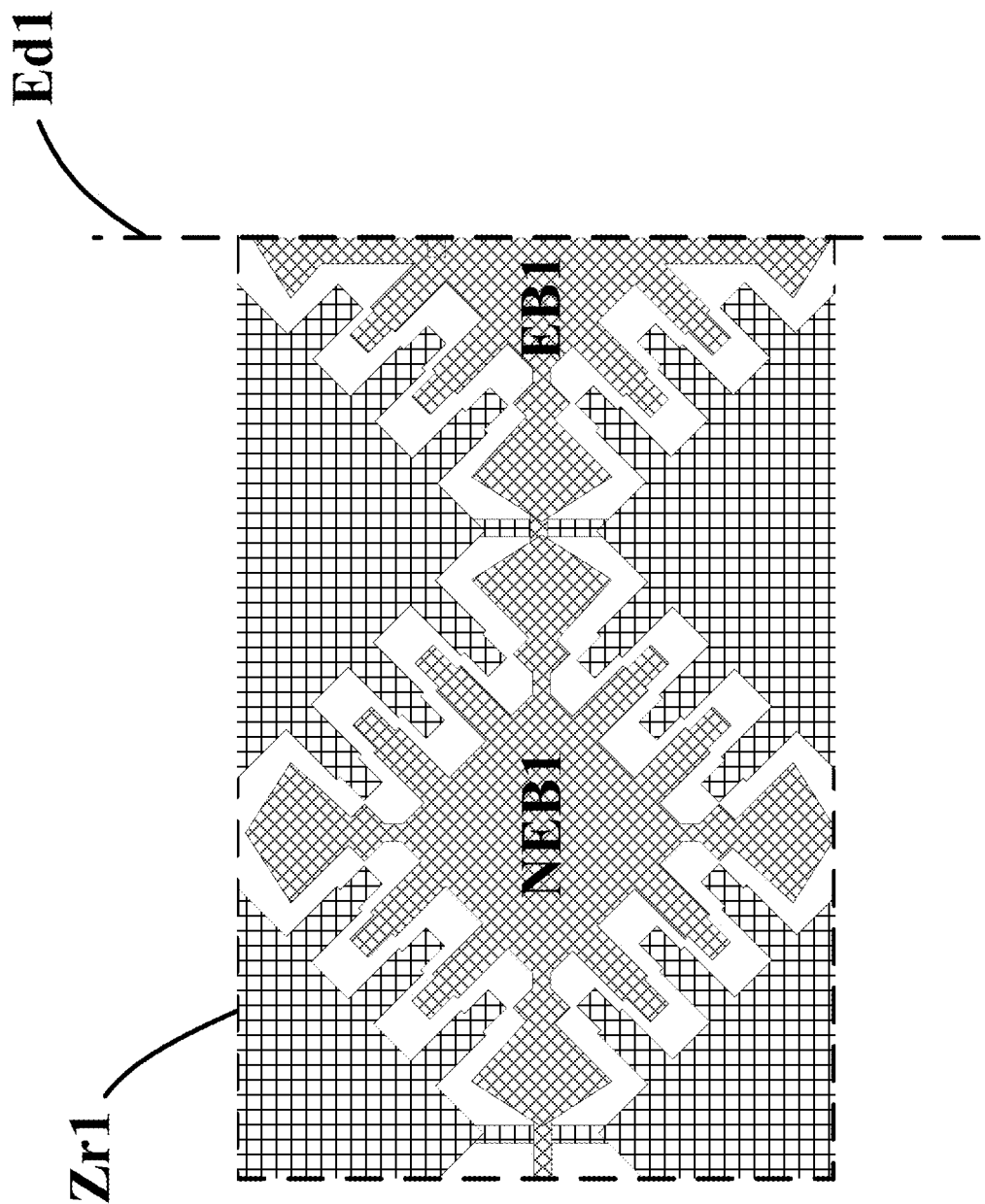
FIG. 2 is a zoom-in view of a first zoom-in region in FIG. 1.
Figure 3:
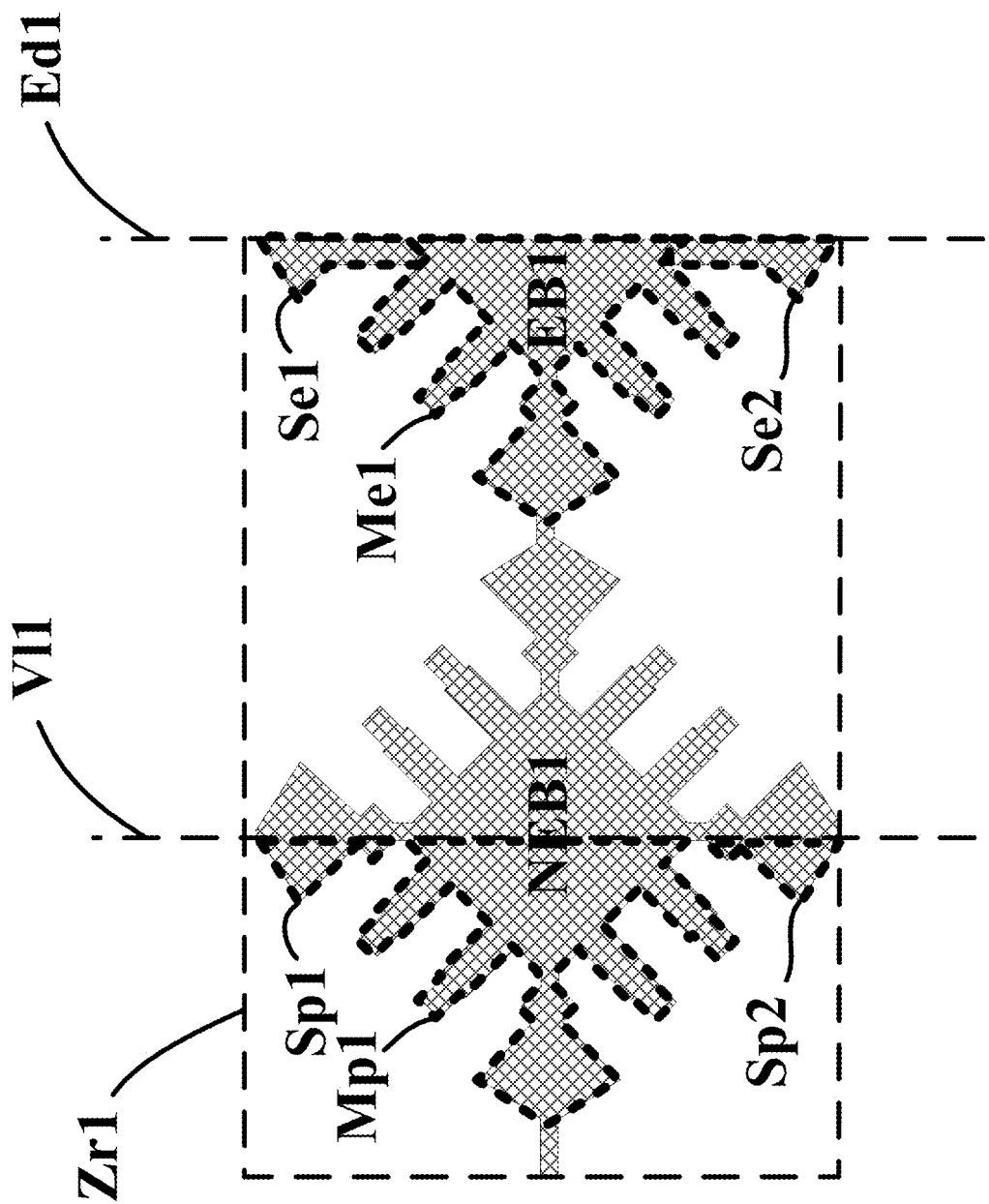
FIG. 3 is a schematic diagram illustrating the structure of a respective row of the first touch electrodes in a first zoom-in region in FIG. 1.

In some embodiments, the plurality of rows of the plurality of first touch electrodes TE1 respectively extend to the first edge Ed1 of the touch control structure. FIG. 2 is a zoom-in view of a first zoom-in region in FIG. 1. FIG. 3 is a schematic diagram illustrating the structure of a respective row of the first touch electrodes in a first zoom-in region in FIG. 1. Referring to FIG. 1 to FIG. 3, a respective row of the plurality of rows includes a plurality of non-edge first electrode blocks NEB1 and a first edge electrode block EB1. Optionally, the first edge electrode block EB1 is along the first edge Ed1. Optionally, the plurality of non-edge first electrode blocks NEB1 have a same shape.

Referring to FIG. 3, the first edge electrode block EB1 includes a first main edge portion Me1 and a first side edge portion Se1 respectively along the first edge Ed1; a respective one of plurality of non-edge first electrode blocks NEB1 includes a first main portion Mp1 and a first side portion Sp1 respectively along a first virtual line Vl1 parallel to the first edge Ed1. In one example, the first main edge portion Me1 corresponds to the first main portion Mp1, and the first side edge portion Se1 corresponds to the first side portion Sp1.

Figure 4:
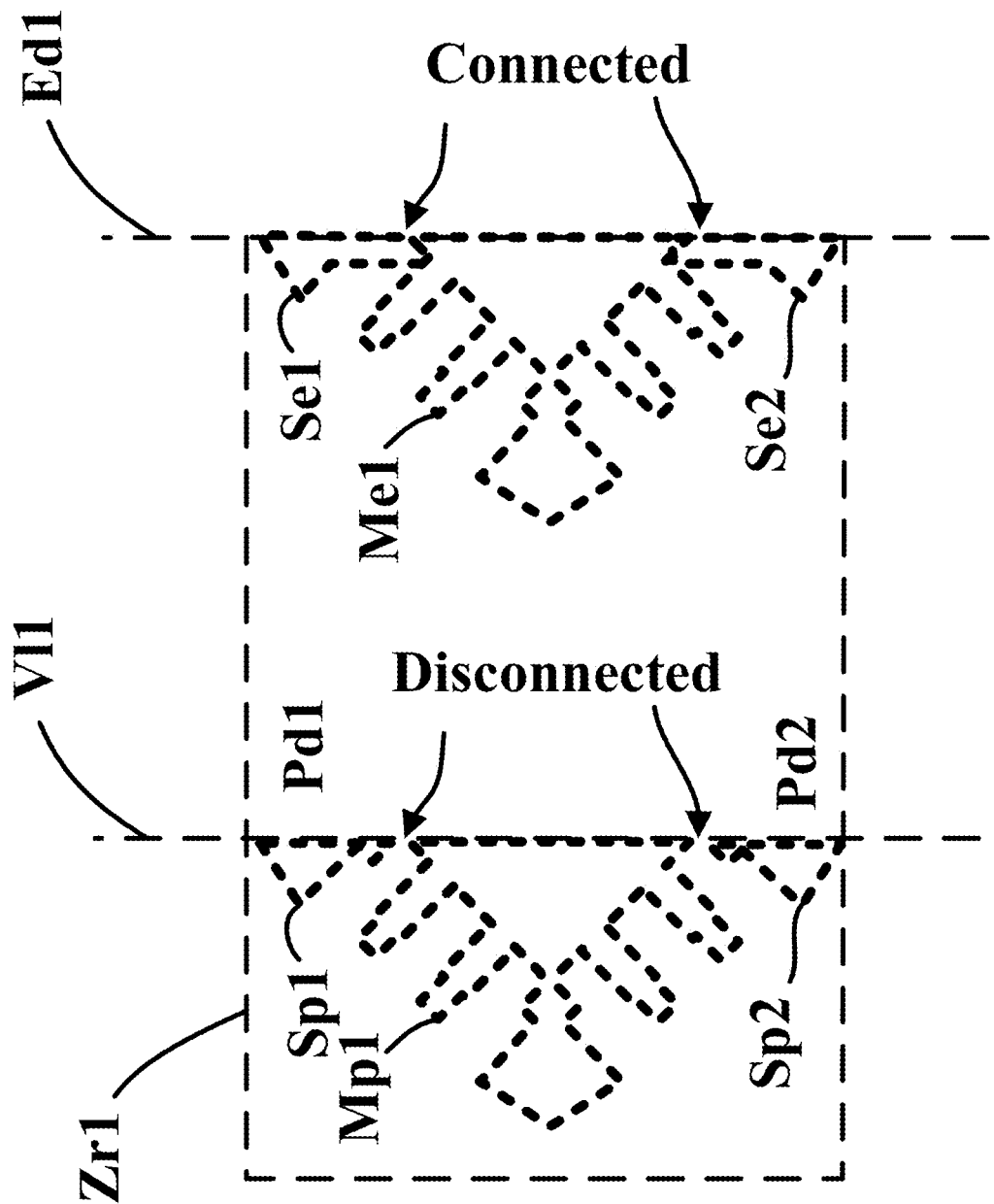

FIG. 4 illustrates boundaries of respective portions of electrodes in FIG. 3. Referring to FIG. 4, along the first virtual line Vl1, boundaries of the first main portion Mp1 and the first side portion Sp1 are disconnected from each other. Along the first edge Ed1, boundaries of the first side edge portion Se1 and the first main edge portion Me1, however, are connected to each other. As shown in FIG. 2 and FIG. 3, the first main edge portion Me1 and the first side edge portion Se1 are directly physically connected to each other. Optionally, the first main edge portion Me1 and the first main portion Mp1 have a same shape.

Figure 5:
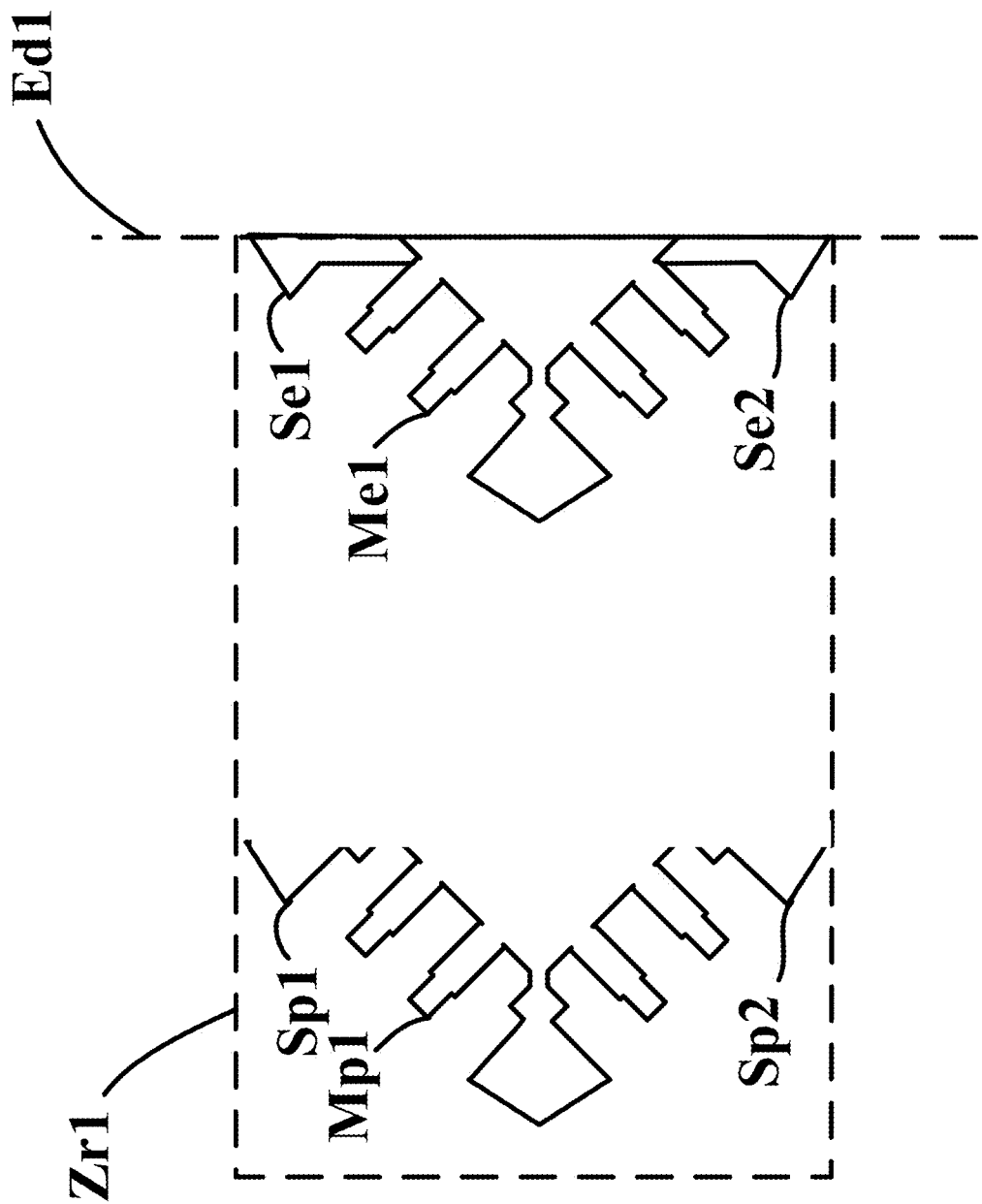
FIG. 5 illustrates external electrode edges of respective portions of electrodes in FIG. 3.

FIG. 5 illustrates external electrode edges of respective portions of electrodes in FIG. 3. External electrode edges refer to actual physical edges in an electrode block. For example, the first main portion Mp1 lacks external electrode edge along the first virtual line Vl1 in FIG. 4, because first main portion Mp1 lacks actual physical edges in an electrode block along the first virtual line Vl1. Referring to FIG. 5, in some embodiments, external electrode edges of the first main edge portion Me1 other than a portion along the first edge Ed1 are identical to external electrode edges of the first main portion Mp1.

Figure 6:
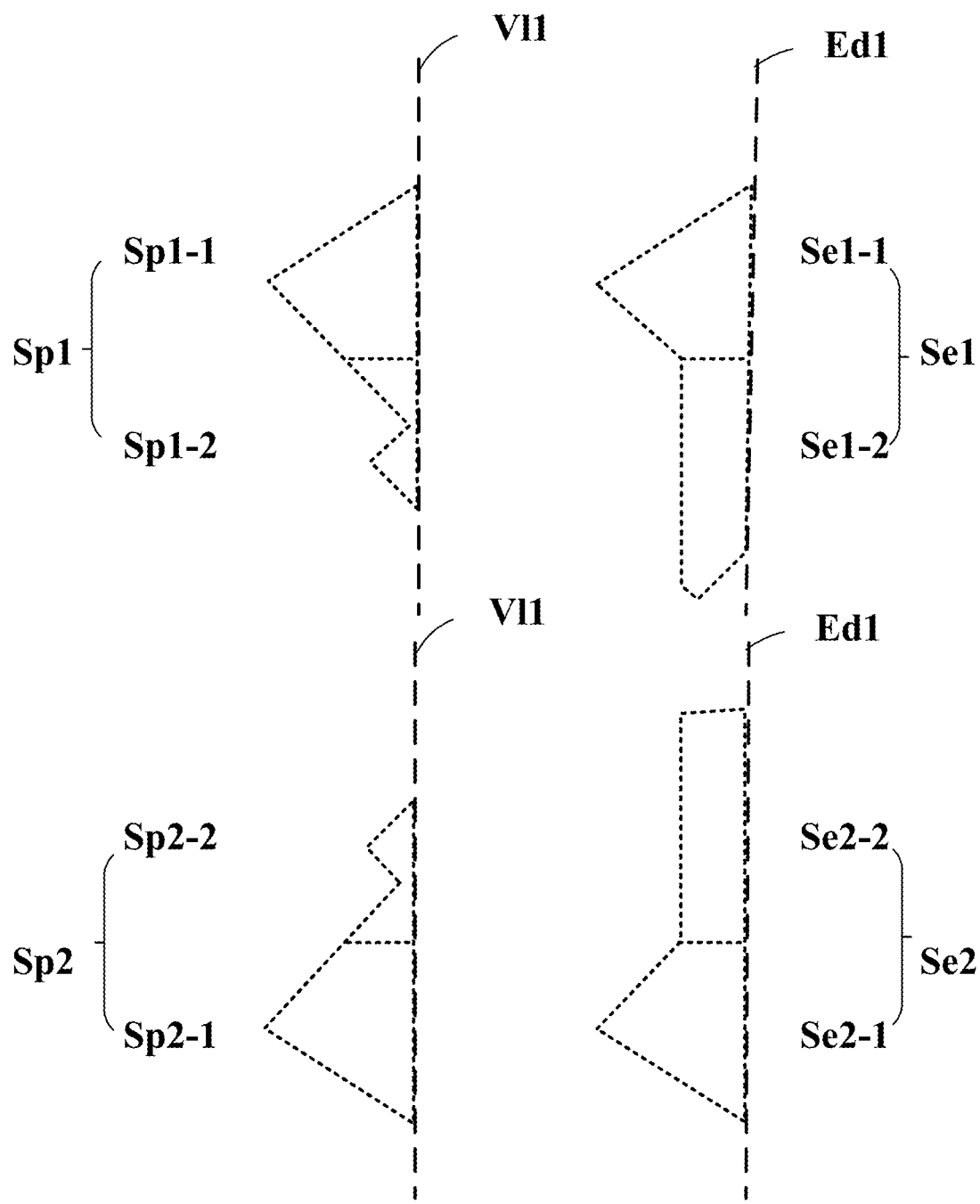
FIG. 6 is a schematic diagram illustrating boundaries of respective portions of electrodes in FIG. 3.

Referring to FIG. 2 to FIG. 5, the first side edge portion Se1 and the first side portion Sp1 have at least partially different shapes and at least partially different external contours. FIG. 6 is a schematic diagram illustrating boundaries of respective portions of electrodes in FIG. 3. Referring to FIG. 6, in some embodiments, the first side edge portion Se1 includes a first outer sub-portion Se1-1 and a first bridge sub-portion Se1-2 respectively along the first edge Ed1. Referring to FIG. 6 and FIG. 4, the first bridge sub-portion Se1-2 directly physically connects the first outer sub-portion Se1-1 to the first main edge portion Me1. The first side portion Sp1 includes a first sub-portion Sp1-1 and a second sub-portion Sp1-2 along the first virtual line Vl1. Referring to FIG. 6 and FIG. 5, external electrode edges of the first outer sub-portion Se1-1 other than a portion along the first edge Ed1 are identical to external electrode edges of the first sub-portion Sp1-1. The first sub-portion Sp1-1 and the first outer sub-portion Se1-1 have a same shape. The first bridge sub-portion Se1-2 and the second sub-portion Sp1-2 have different shapes and different external contours. Referring to FIG. 6 and FIG. 4, along the first virtual line Vl1, boundaries of the second sub-portion Sp1-2 and the first main portion Sp1 are disconnected from each other.

As shown in FIG. 1 to FIG. 6, in some embodiments, the first main portion Sp1 and the first main edge portion Me1 have a first translational symmetry, and the first outer sub-portion Se1-1 and the first sub-portion Sp1-1 have a second translational symmetry. Optionally, the first translational symmetry and the second translational symmetry are the same.

As shown in FIG. 3, in some embodiments, the first side portion Sp1 is at least a portion of a protrusion of the respective one of plurality of non-edge first electrode blocks NEB1; the first side edge portion Se1 is a protrusion of the first edge electrode block EB1.

Figure 7:
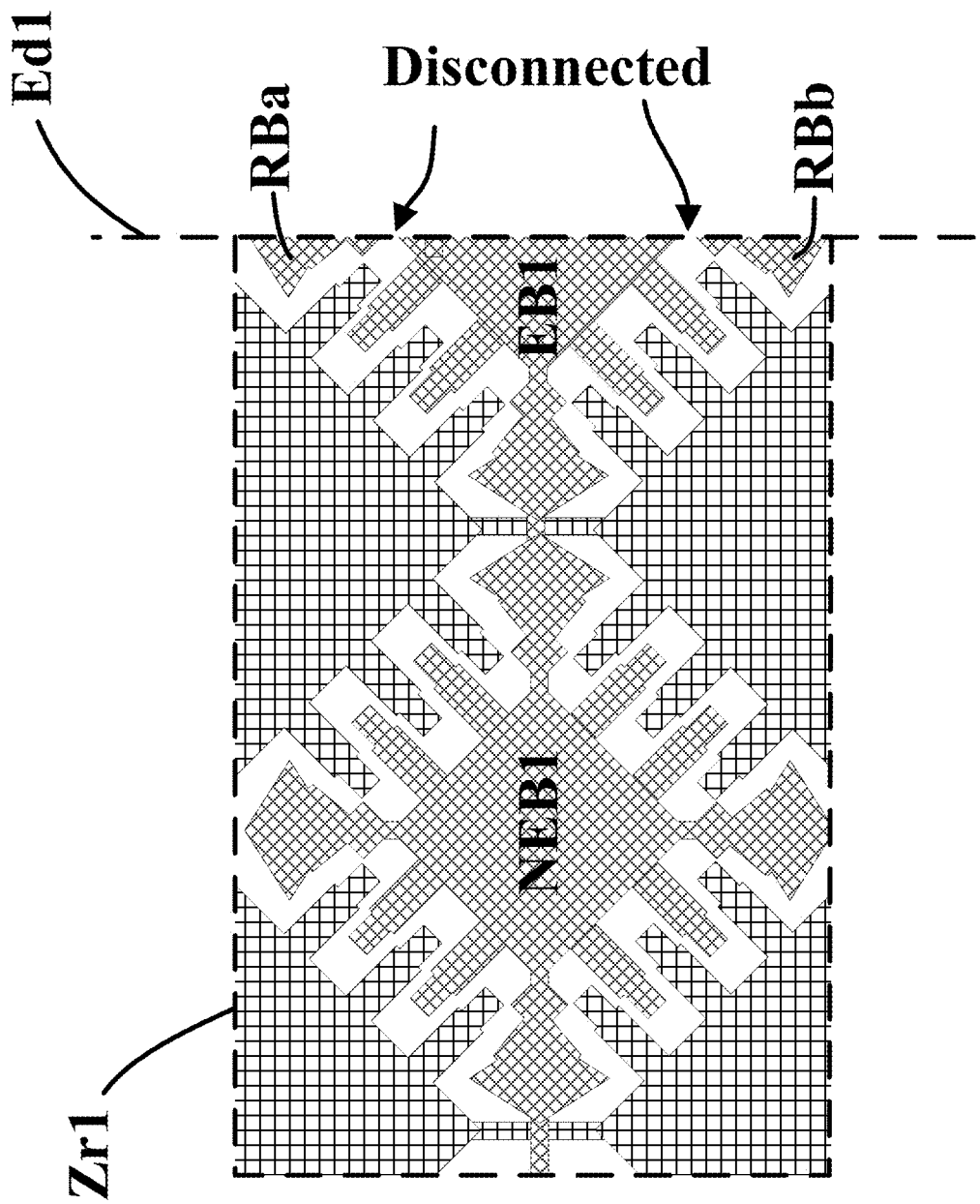
FIG. 7 is a schematic diagram illustrating the structure of a touch control structure in some embodiments according to the present disclosure.

If the touch control structure adopts a uniform design throughout the entire structure, along the edge of the touch control structure, some electrode blocks may not be connected. FIG. 7 is a schematic diagram illustrating the structure of a touch control structure in some embodiments according to the present disclosure. Referring to FIG. 7, along the first edge Ed1 of the touch control structure, the touch control structure further includes residual electrode blocks RBa and RBb respectively disconnected from the first edge electrode block EB1. The presence of residual electrode blocks such as the residual electrode blocks RBa and RBb in the touch control structure results in a reduced adjacent electrode interface between the plurality of first touch electrodes and the plurality of second touch electrodes along edges such as the first edge Ed1. If not compensated, the reduced adjacent electrode interface results in a reduced mutual capacitance along these edges, leading to non-uniformity of mutual capacitance and touch control performance along these edges. The first edge Ed1 may be any edge of the touch control structure, for example, an edge along a lateral side of the touch control structure, an edge along a corner of the touch control structure, or an edge along an internal window region of the touch control structure. The internal window region may be a region in which a hole is punched through the touch control structure.

To enhance mutual capacitance uniformity and touch performance throughout the touch control structure, the first edge electrode block EB1 in the present disclosure 0 is formed to have a different structure from the plurality of non-edge first electrode blocks NEB1, thereby preventing existence of the residual electrode blocks along the edge. A substantially more uniform mutual capacitance and touch control performance along the edges can be achieved in the present touch control structure.

Referring to FIG. 1 to FIG. 6 again, in some embodiments, the first edge electrode block EB1 further includes a second side edge portion Se2. The first side edge portion Se1, the first main edge portion EB1, and second side edge portion Se2 are sequentially arranged along the first edge Ed1. Similarly, the respective one of plurality of non-edge first electrode blocks NEB1 further includes a second side portion Sp2. The first side portion Sp1, the first main portion Mp1, and the second side portion Sp2 are sequentially arranged along the first virtual line Vl1. Along the first virtual line Vl1, boundaries of the first main portion Mp1 and the first side portion Sp1 are disconnected from each other, and boundaries of the first main portion Mp1 and the second side portion Sp2 are disconnected from each other. The first main edge portion Me1 and the first side edge portion Se1 are directly physically connected to each other; and the first main edge portion Me1 and the second side edge portion Se2 are directly physically connected to each other. The first side edge portion Se1 and the first side portion Sp1 have at least partially different shapes and at least partially different external contours; and the second side edge portion Se2 and the second side portion Sp2 have at least partially different shapes and at least partially different external contours.

Referring to FIG. 6, in some embodiments, the first side edge portion Se1 includes a first outer sub-portion Se1-1 and a first bridge sub-portion Se1-2 respectively along the first edge Ed1; and the second side edge portion Se2 includes a second outer sub-portion Se2-1 and a second bridge sub-portion Se2-2 respectively along the first edge Ed1.

Referring to FIG. 6 and FIG. 4, the first bridge sub-portion Se1-2 directly physically connects the first outer sub-portion Se1-1 to the first main edge portion Me1; and the second bridge sub-portion Se2-2 directly physically connecting the second outer sub-portion Se2-1 to the first main edge portion Me1. The first side portion Sp1 includes a first sub-portion Sp1-1 and a second sub-portion Sp1-2 along the first virtual line Vl1; and the second side portion Sp2 includes a third sub-portion Sp2-1 and a fourth sub-portion Sp2-2 along the first virtual line Vl1. Referring to FIG. 6 and FIG. 5, external electrode edges of the first outer sub-portion Se1-1 other than a portion along the first edge Ed1 are identical to external electrode edges of the first sub-portion Sp1-1; and external electrode edges of the second outer sub-portion Se2-1 other than a portion along the first edge Ed1 are identical to external electrode edges of the third sub-portion Sp2-1. The first sub-portion Sp1-1 and the first outer sub-portion Se1-1 have a same shape; and the third sub-portion Sp2-1 and the second outer sub-portion Se2-1 have a same shape. The first bridge sub-portion Se1-2 and the second sub-portion Sp1-2 have different shapes and different external contours; and the second bridge sub-portion Se2-2 and the fourth sub-portion Sp2-2 have different shapes and different external contours. Referring to FIG. 6 and FIG. 4, along the first virtual line Vl1, boundaries of the second sub-portion Sp1-2 and the first main portion Sp1 are disconnected from each other; and along the first virtual line, boundaries of the fourth sub-portion Sp2-2 the first main portion Sp1 are disconnected from each other.

As shown in FIG. 1 to FIG. 6, in some embodiments, the first main portion Sp1 and the first main edge portion Me1 have a first translational symmetry, the first outer sub-portion Se1-1 and the first sub-portion Sp1-1 have a second translational symmetry, and the second outer sub-portion Se2-1 and the third sub-portion Sp2-1 have a third translational symmetry. Optionally, the first translational symmetry, the second translational symmetry, and the third translational symmetry are the same.

As shown in FIG. 3, in some embodiments, the first side portion Sp1 and the second side portion Sp2 are respectively at least portions of protrusions of the respective one of plurality of non-edge first electrode blocks NEB1 (e.g., upper and lower protrusions of the respective one of plurality of non-edge first electrode blocks NEB1 in FIG. 3); the first side edge portion Se1 and the second side edge portion Se2 are respectively protrusions of the first edge electrode block EB1 (e.g., upper and lower protrusions of the first edge electrode block EB1 in FIG. 3).

In some embodiments, and referring to FIG. 1 again, the plurality of column of the plurality of second touch electrodes TE2 include a plurality of non-edge columns Cne and an edge-adjacent column Cea, the edge-adjacent column Cea being directly adjacent to multiple first edge electrode blocks respectively from the plurality of rows of the plurality of first touch electrodes TEL The multiple first edge electrode blocks include the first edge electrode block EB1 as shown in FIG. 1. Each of the multiple first edge electrode blocks (e.g., the first edge electrode block EB1) is along the first edge Ed1. As shown in FIG. 1, the edge-adjacent column Cea includes a plurality of edge-adjacent electrode blocks EAB electrically connected together; and a respective one of the plurality of non-edge columns Cne includes a plurality of non-edge second electrode blocks NEB2 electrically connected together.

Figure 8:
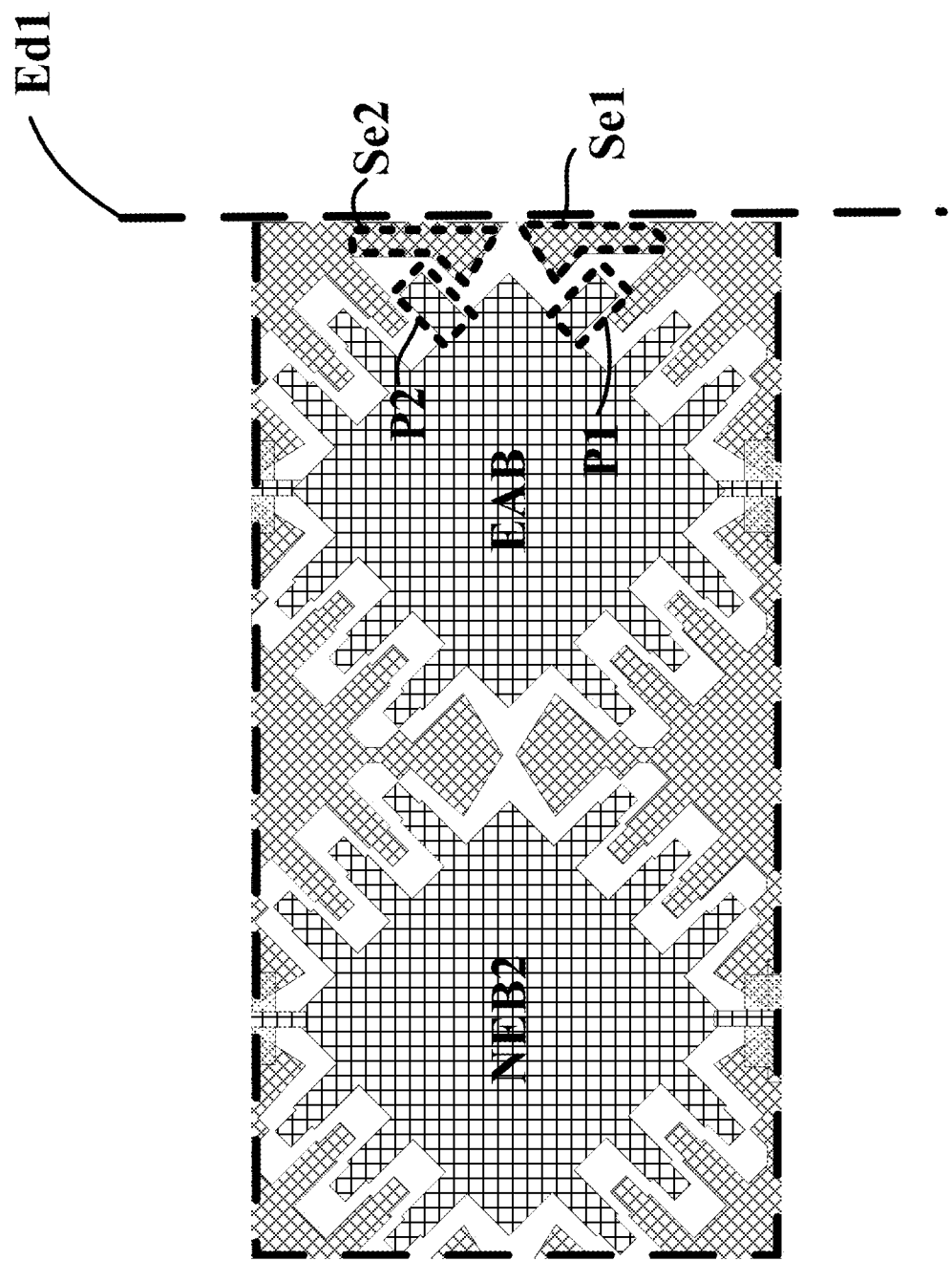
FIG. 8 is a zoom-in view of a second zoom-in region in FIG. 1.

FIG. 8 is a zoom-in view of a second zoom-in region in FIG. 1. Referring to FIG. 8, external electrode edges of a respective one of the plurality of edge-adjacent electrode blocks EAB are identical to external electrode edges of a respective one of the plurality of non-edge second electrode blocks NEB2 except for a first portion P1 directly adjacent to the first side edge portion Se1 in an adjacent row of the plurality of rows. Optionally, the first portion P1 is a protrusion of the respective one of the plurality of edge-adjacent electrode blocks NEB2. As compared to other protrusions of the respective one of the plurality of edge-adjacent electrode blocks NEB2, the first portion P1 is shortened.

In some embodiments, external electrode edges of a respective one of the plurality of edge-adjacent electrode blocks EAB are identical to external electrode edges of a respective one of the plurality of non-edge second electrode blocks NEB2 except for a first portion P1 directly adjacent to the first side edge portion Se1 in an adjacent row of the plurality of rows and a second portion P2 directly adjacent to the second side edge portion Se2 in a second adjacent row of the plurality of rows. Optionally, the first portion P1 and the second portion P2 are respectively protrusions of the respective one of the plurality of edge-adjacent electrode blocks NEB2. As compared to other protrusions of the respective one of the plurality of edge-adjacent electrode blocks NEB2, the first portion P1 is shortened, and the second portion P2 is shortened.

Referring to FIG. 1, in some embodiments, the touch control structure further includes a plurality of first touch signal lines SL1 respectively connected to the plurality of rows; and a plurality of second touch signal lines SL2 respectively connected to the plurality of columns. As shown in FIG. 1, in some embodiments, on the left side, the plurality of rows of the plurality of first touch electrodes TE1 respectively extend to a second edge Ed2 of the touch control structure; on the right side, the plurality of rows of the plurality of first touch electrodes TE1 respectively extend to the first edge Ed1 of the touch control structure. Optionally, the second edge Ed2 is opposite to the first edge Ed1. The plurality of first touch signal lines SL1 in some embodiments respectively connect to electrode blocks of the plurality of first touch electrodes TE1 respectively in the plurality of rows on the left side, e.g., along the second edge Ed2. However, the plurality of first touch signal lines SL1 are not directly connect to electrode blocks of the plurality of first touch electrodes TE1 respectively in the plurality of rows on the right side, e.g., along the first edge Ed1.

In some embodiments, the first edge electrode block EB1 is indirectly electrically connected to a respective one of the plurality of first touch signal lines SL1 through at least the plurality of non-edge first electrode blocks NEB1. However, the first edge electrode block EB1 is not directly connected to any of the plurality of first touch signal lines SL1 or the plurality of second touch signal lines SL2.

Figure 9:
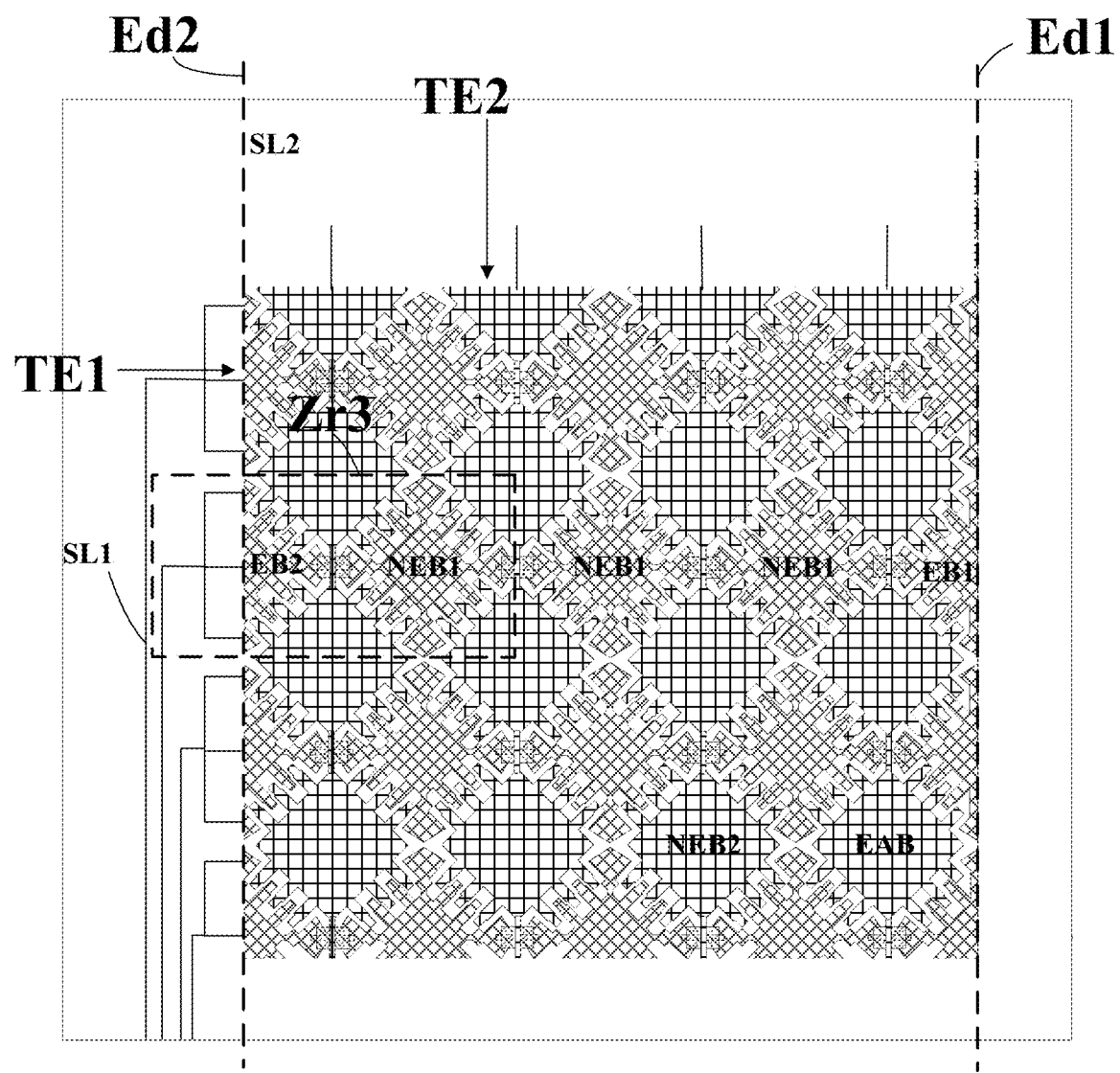
FIG. 9 is a schematic diagram illustrating the structure of a touch control structure in some embodiments according to the present disclosure.
Figure 10:
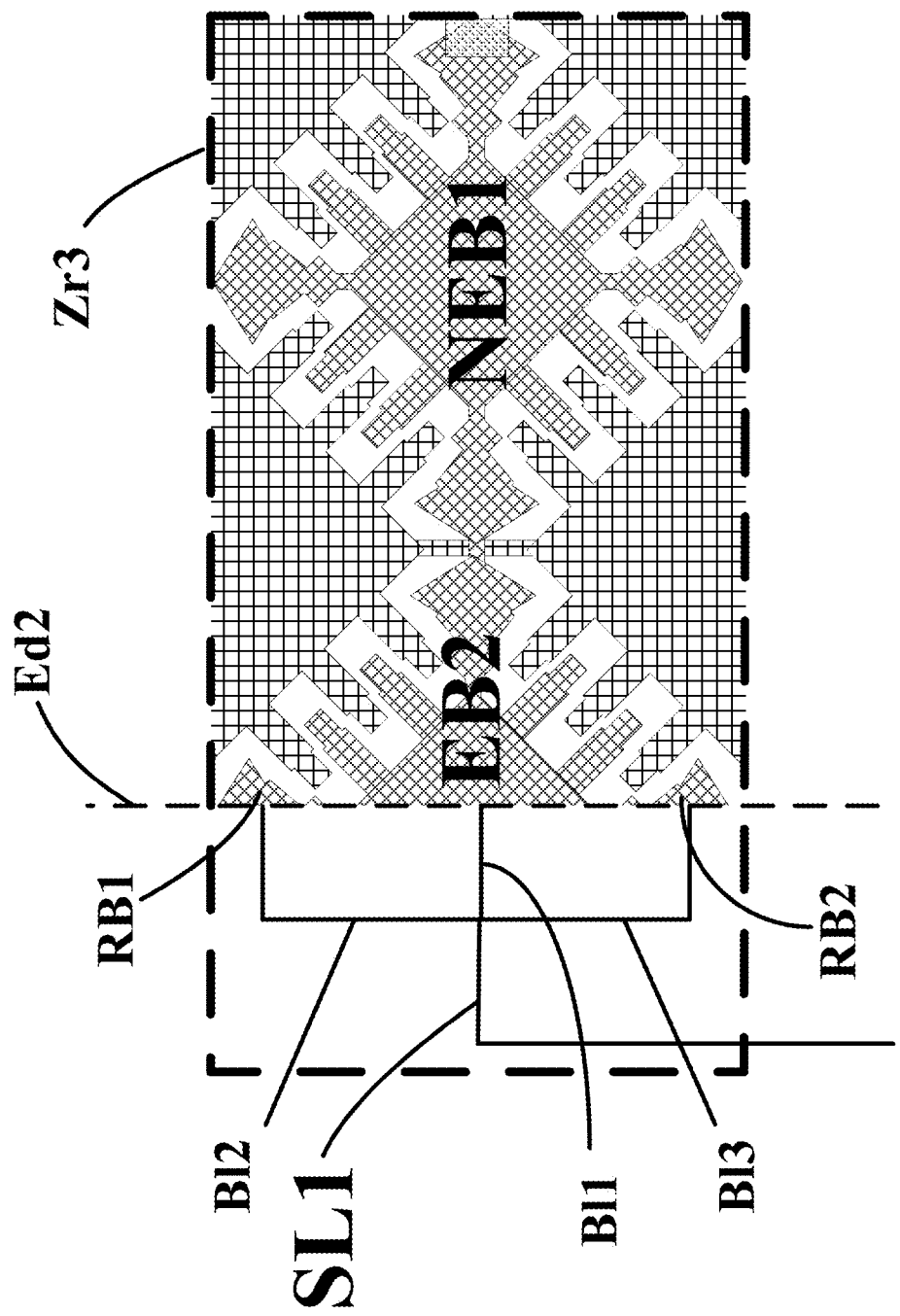
FIG. 10 is a zoom-in view of a third zoom-in region in FIG. 9.

FIG. 9 is a schematic diagram illustrating the structure of a touch control structure in some embodiments according to the present disclosure. FIG. 10 is a zoom-in view of a third zoom-in region in FIG. 9. Referring to FIG. 9 and FIG. 10, in some embodiments, the respective row of the plurality of rows further includes a second edge electrode block EB2 and a first residual electrode block RB1. The second edge electrode block EB2 and the first residual electrode block RB1 are along the second edge Ed2. Optionally, the second edge Ed2 is an edge opposite to the first edge Ed1. Optionally, the respective row includes the second edge electrode block EB2 and the first residual electrode block RB1 along the second edge Ed2 (on the left side), the plurality of non-edge electrode blocks NEB in the middle of the row, and the first edge electrode block EB1 along the first edge Ed1 (on the right side). The plurality of non-edge electrode blocks NEB in the middle connect the first edge electrode block EB1 and the second edge electrode block EB2 together.

Referring to FIG. 9 and FIG. 10, in some embodiments, the second edge electrode block EB2 and the first residual electrode block RB1 are directly connected to the respective one of the plurality of first touch signal lines SL1, while the first residual electrode block RB1 is isolated from electrode blocks of any adjacent row of the plurality of rows.

Referring to FIG. 10, in some embodiments, the respective one of the plurality of first touch signal lines SL1 includes a first branch line Bl1 and a second branch line Bl2 electrically connected in parallel (e.g., connected to a main line of the respective one of the plurality of first touch signal lines SL1). The second edge electrode block EB2 is directly connected to the first branch line Bl1, the first residual electrode block RB1 is directly connected to the second branch line Bl2.

Figure 11:
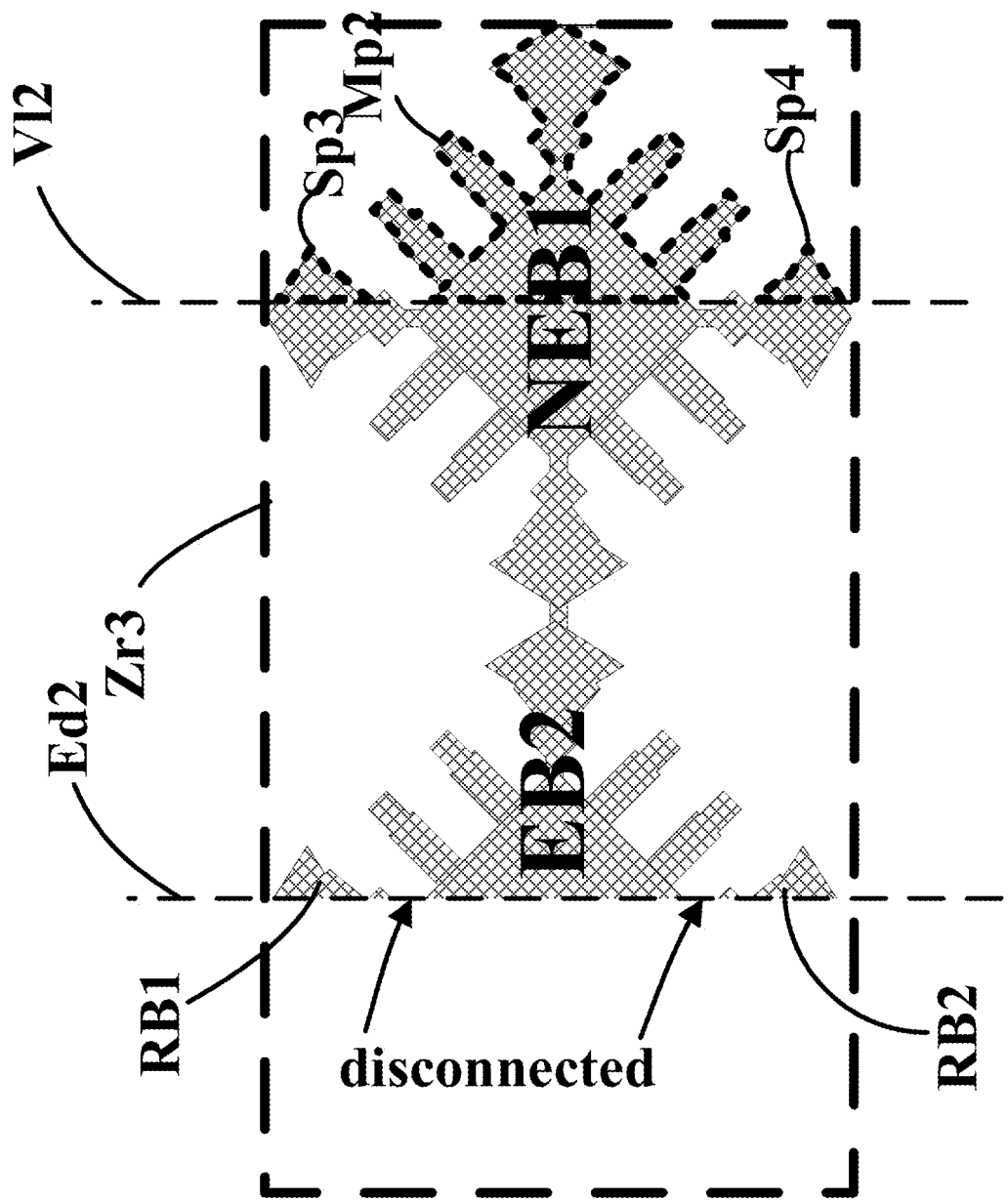
FIG. 11 is a schematic diagram illustrating the structure of a respective row of the first touch electrodes in a third zoom-in region in FIG. 9.

Referring to FIG. 9, the first residual electrode block RB1 is isolated from electrode blocks of any adjacent row of the plurality of rows. FIG. 11 is a schematic diagram illustrating the structure of a respective row of the first touch electrodes in a third zoom-in region in FIG. 9. Referring to FIG. 11, the first residual electrode block RB1 is also isolated from the second edge electrode block EB2. The first residual electrode block RB1 and the second edge electrode block EB2 are disconnected from each other because they are present along the second edge Ed2 of the touch control structure. In a respective one of the plurality of non-edge first electrode blocks NEB1 that is not along the second edge Ed2 or the first edge Ed1, protrusions of the electrode block are connected to a center portion. In one example, the second edge electrode block EB2 corresponds to a second main portion Mp2 of the respective one of the plurality of non-edge first electrode blocks NEB1, and the first residual electrode block RB1 corresponds to a third side portion Sp3 of the respective one of the plurality of non-edge first electrode blocks NEB1.

Figure 12:
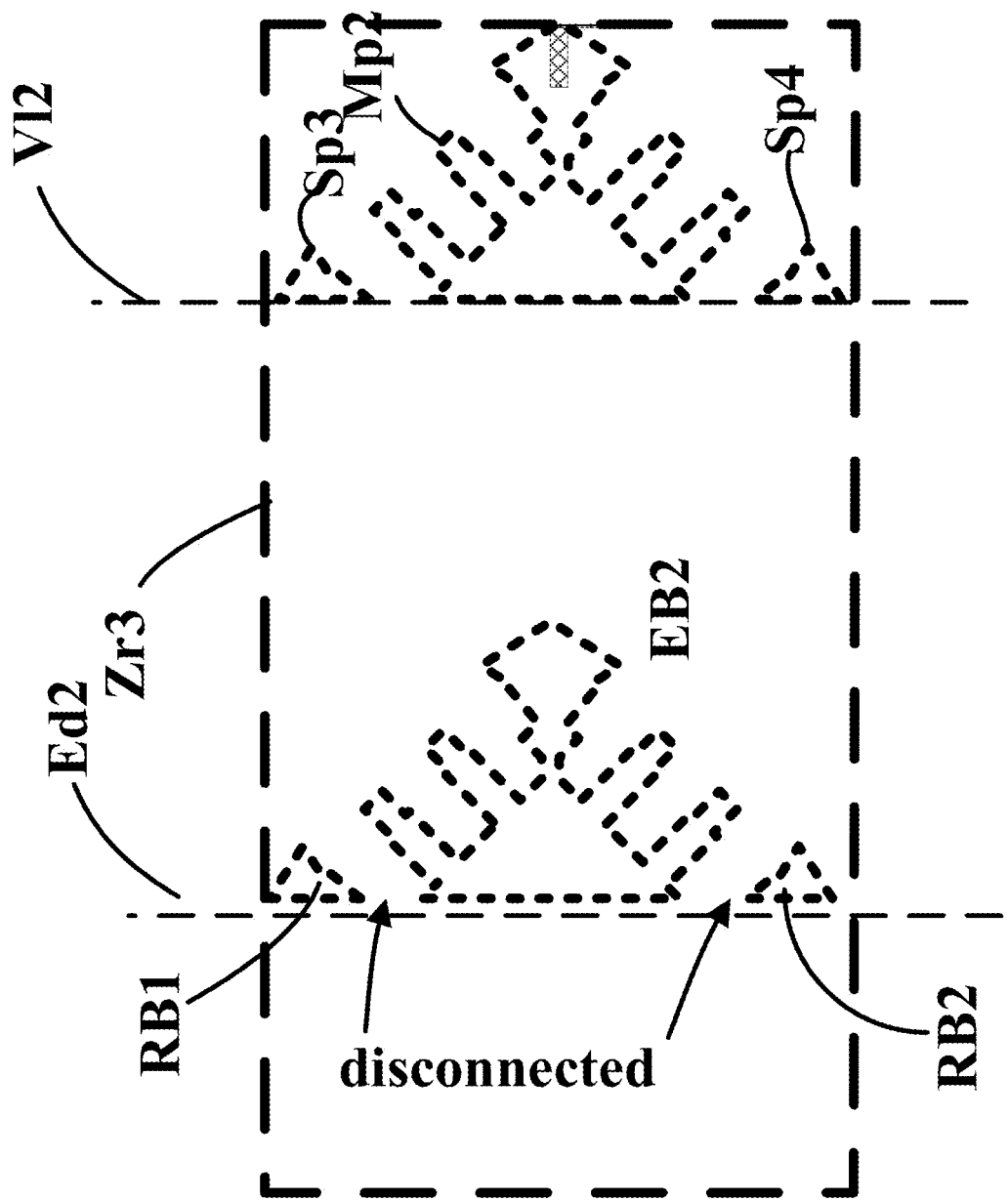
FIG. 12 illustrates boundaries of respective portions of electrodes in FIG. 11.
Figure 13:
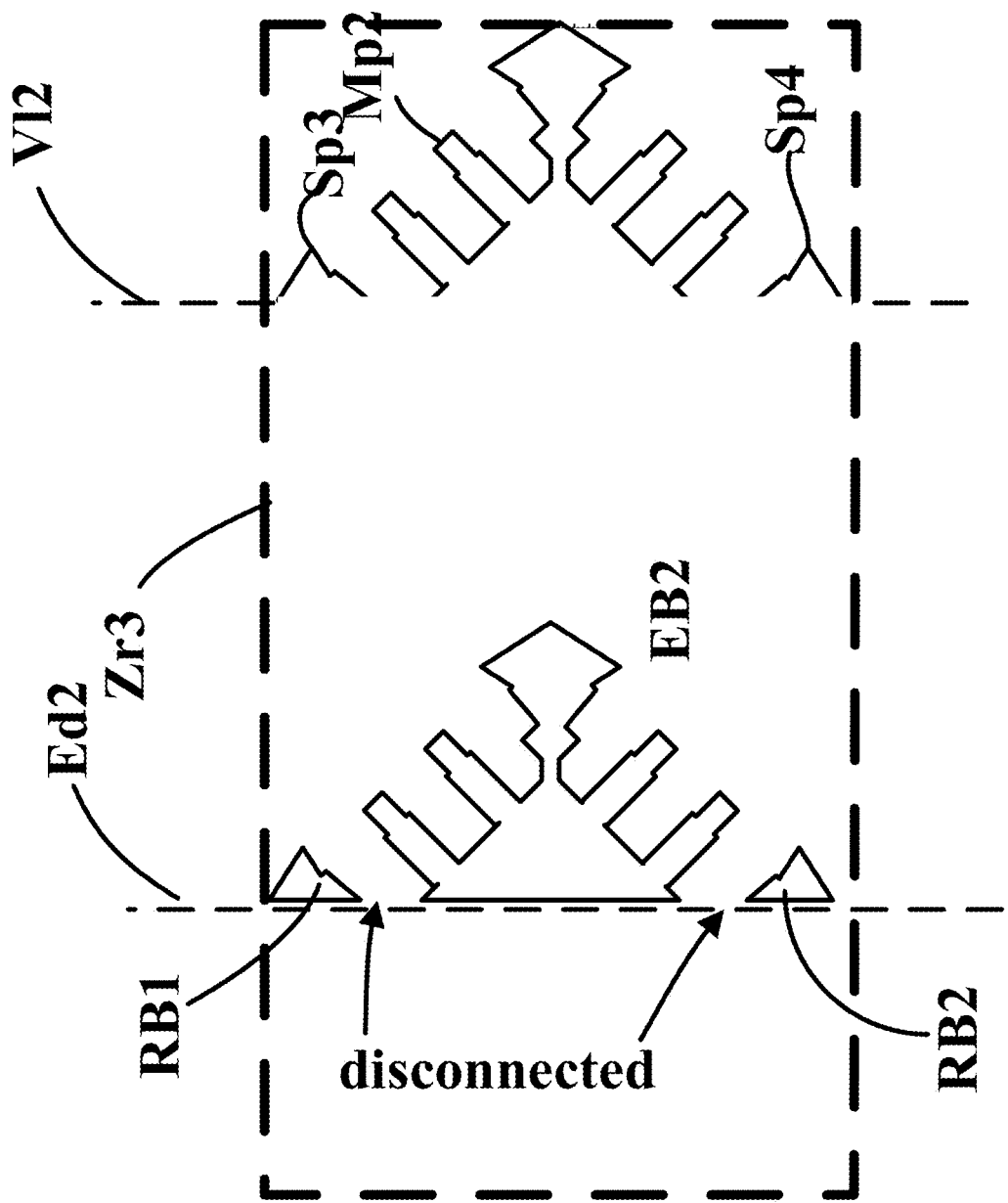
FIG. 13 illustrates external electrode edges of respective portions of electrodes in FIG. 11.

In some embodiments, the respective one of plurality of non-edge first electrode blocks NEB1 includes a second main portion Mp2 and a third side portion Sp3 respectively along a second virtual line Vl2 parallel to the second edge Ed2. Along the second virtual line Vl2, boundaries of the second main portion Mp2 and the third side portion Sp3 are disconnected from each other. Optionally, the second edge electrode block EB2 and the second main portion Mp2 have a same shape; and the first residual electrode block RB1 and the third side portion Sp3 have a same shape. FIG. 12 illustrates boundaries of respective portions of electrodes in FIG. 11. FIG. 13 illustrates external electrode edges of respective portions of electrodes in FIG. 11. As shown in FIG. 11 to FIG. 13, external electrode edges of the second edge electrode block EB2 other than a portion along the second edge Ed2 are identical to external electrode edges of the second main portion Mp2; and external electrode edges of the first residual electrode block RB1 other than a portion along the second edge Ed2 are identical to external electrode edges of the third side portion Sp3.

Optionally, the third side portion Sp3 is at least a portion of a protrusion of the respective one of plurality of non-edge first electrode blocks NEB1 (e.g., an upper protrusion of the respective one of plurality of non-edge first electrode blocks NEB1).

Referring to FIG. 9 and FIG. 10 again, in some embodiments, the respective row of the plurality of rows further includes a second residual electrode block RB2. The first residual electrode block RB1, the second edge electrode block EB2, and the second residual electrode block RB2 are sequentially arranged along the second edge Ed2. Optionally, the second edge Ed2 is an edge opposite to the first edge Ed1. Optionally, the respective row includes the first residual electrode block RB1, the second edge electrode block EB2, and the second residual electrode block RB2 along the second edge Ed2 (on the left side), the plurality of non-edge electrode blocks NEB in the middle of the row, and the first edge electrode block EB1 along the first edge Ed1 (on the right side). The plurality of non-edge electrode blocks NEB in the middle connect the first edge electrode block EB1 and the second edge electrode block EB2 together.

Referring to FIG. 9 and FIG. 10, in some embodiments, the first residual electrode block RB1, the second edge electrode block EB2, and the second residual electrode block RB2 are respectively directly connected to the respective one of the plurality of first touch signal lines SL1, while the first residual electrode block RB1 is isolated from electrode blocks of any adjacent row of the plurality of rows, and the second residual electrode block RB2 is isolated from electrode blocks of any adjacent row of the plurality of rows.

Referring to FIG. 10, in some embodiments, the respective one of the plurality of first touch signal lines SL1 includes a first branch line Bl1, a second branch line Bl2, and a third branch line Bl3 electrically connected in parallel (e.g., connected to a main line of the respective one of the plurality of first touch signal lines SL1). The second edge electrode block EB2 is directly connected to the first branch line Bl1, the first residual electrode block RB1 is directly connected to the second branch line Bl2, and the second residual electrode block RB2 directly connected to the third branch line Bl3.

Referring to FIG. 11 to FIG. 13, the first residual electrode block RB1 is isolated from electrode blocks of any adjacent row of the plurality of rows, the second residual electrode block RB2 is isolated from electrode blocks of any adjacent row of the plurality of rows. Referring to FIG. 11, the first residual electrode block RB1 is also isolated from the second edge electrode block EB2, and the second residual electrode block RB2 is also isolated from the second edge electrode block EB2. The first residual electrode block RB1 and the second edge electrode block EB2 are disconnected from each other, the second residual electrode block RB2 and the second edge electrode block EB2 are disconnected from each other, because they are present along the second edge Ed2 of the touch control structure. In a respective one of the plurality of non-edge first electrode blocks NEB1 that is not along the second edge Ed2 or the first edge Ed1, protrusions of the electrode block are connected to a center portion. In one example, the second edge electrode block EB2 corresponds to a second main portion Mp2 of the respective one of the plurality of non-edge first electrode blocks NEB1, the first residual electrode block RB1 corresponds to a third side portion Sp3 of the respective one of the plurality of non-edge first electrode blocks NEB1, and the second residual electrode block RB2 corresponds to a fourth side portion Sp4 of the respective one of the plurality of non-edge first electrode blocks NEB1.

In some embodiments, the respective one of plurality of non-edge first electrode blocks NEB1 includes a second main portion Mp2, a third side portion Sp3, and a fourth side portion Sp4 respectively along a second virtual line Vl2 parallel to the second edge Ed2. Along the second virtual line Vl2, boundaries of the second main portion Mp2 and the third side portion Sp3 are disconnected from each other; and boundaries of the second main portion Mp2 and the fourth side portion Sp4 are disconnected from each other. Optionally, the second edge electrode block EB2 and the second main portion Mp2 have a same shape; the first residual electrode block RB1 and the third side portion Sp3 have a same shape, and the second residual electrode block RB2 and the fourth side portion Sp4 have a same shape. As shown in FIG. 11 to FIG. 13, external electrode edges of the second edge electrode block EB2 other than a portion along the second edge Ed2 are identical to external electrode edges of the second main portion Mp2; external electrode edges of the first residual electrode block RB1 other than a portion along the second edge Ed2 are identical to external electrode edges of the third side portion Sp3; and external electrode edges of the second residual electrode block RB2 other than a portion along the second edge Ed2 are identical to external electrode edges of the fourth side portion Sp4.

Optionally, the third side portion Sp3 and the fourth side portion Sp4 are respectively at least portions of protrusions of the respective one of plurality of non-edge first electrode blocks NEB1 (e.g., upper and lower protrusions of the respective one of plurality of non-edge first electrode blocks NEB1).

Optionally, the second edge electrode block EB2 and the first edge electrode block EB1 are respectively a first electrode block and a last electrode block in a same row of the plurality of rows.

The presence of residual electrode blocks such as the first residual electrode block RB1 and the second residual electrode block RB2 in the touch control structure results in a reduced adjacent electrode interface between the plurality of first touch electrodes TE1 and the plurality of second touch electrodes TE2 along edges such as the second edge Ed2. If not compensated, the reduced adjacent electrode interface results in a reduced mutual capacitance along these edges, leading to non-uniformity of mutual capacitance and touch control performance along these edges. The second edge Ed2 may be any edge of the touch control structure, for example, an edge along a lateral side of the touch control structure, an edge along a corner of the touch control structure, or an edge along an internal window region of the touch control structure. The internal window region may be a region in which a hole is punched through the touch control structure.

To enhance mutual capacitance uniformity and touch performance throughout the touch control structure, branch lines may be formed to respectively electrically connect the first residual electrode block RB1 to the second edge electrode block EB2, and electrically connect the second residual electrode block RB2 to the second edge electrode block EB2. A substantially more uniform mutual capacitance and touch control performance along the edges can be achieved in the present touch control structure.

Figure 14:
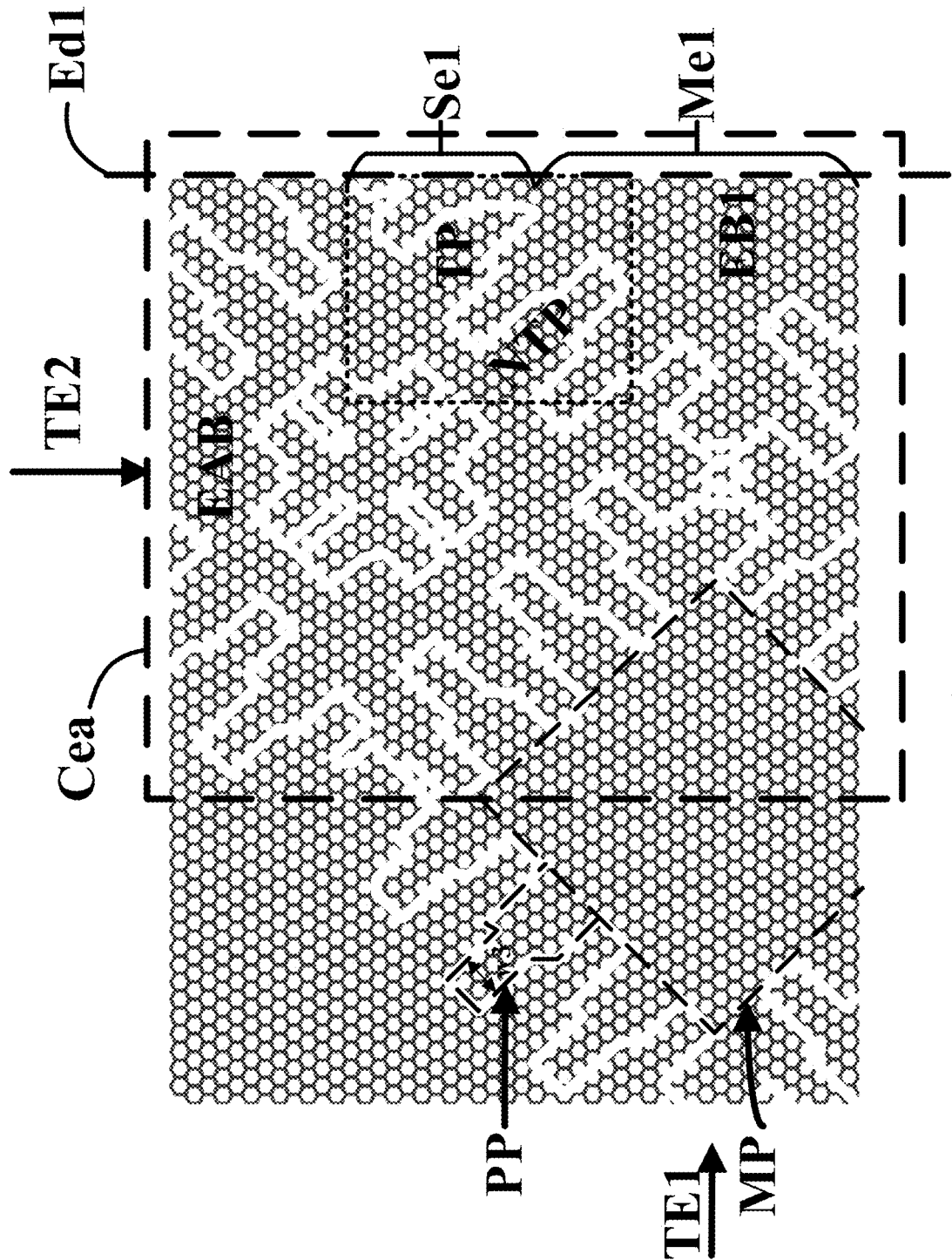
FIG. 14 is a partial view of a region of a touch control structure along a first edge in some embodiments according to the present disclosure.

FIG. 14 is a partial view of a region of a touch control structure along a first edge in some embodiments according to the present disclosure. Referring to FIG. 14, the first edge electrode block EB1 in some embodiments includes a first main edge portion Me1 and a first side edge portion Se1 respectively along the first edge Ed1. Electrode blocks of the plurality of first touch electrodes TE1 and the plurality of second touch electrodes TE2 are in a same layer, and respectively comprises a main portion MP and protrusion portions PP.

Figure 15:
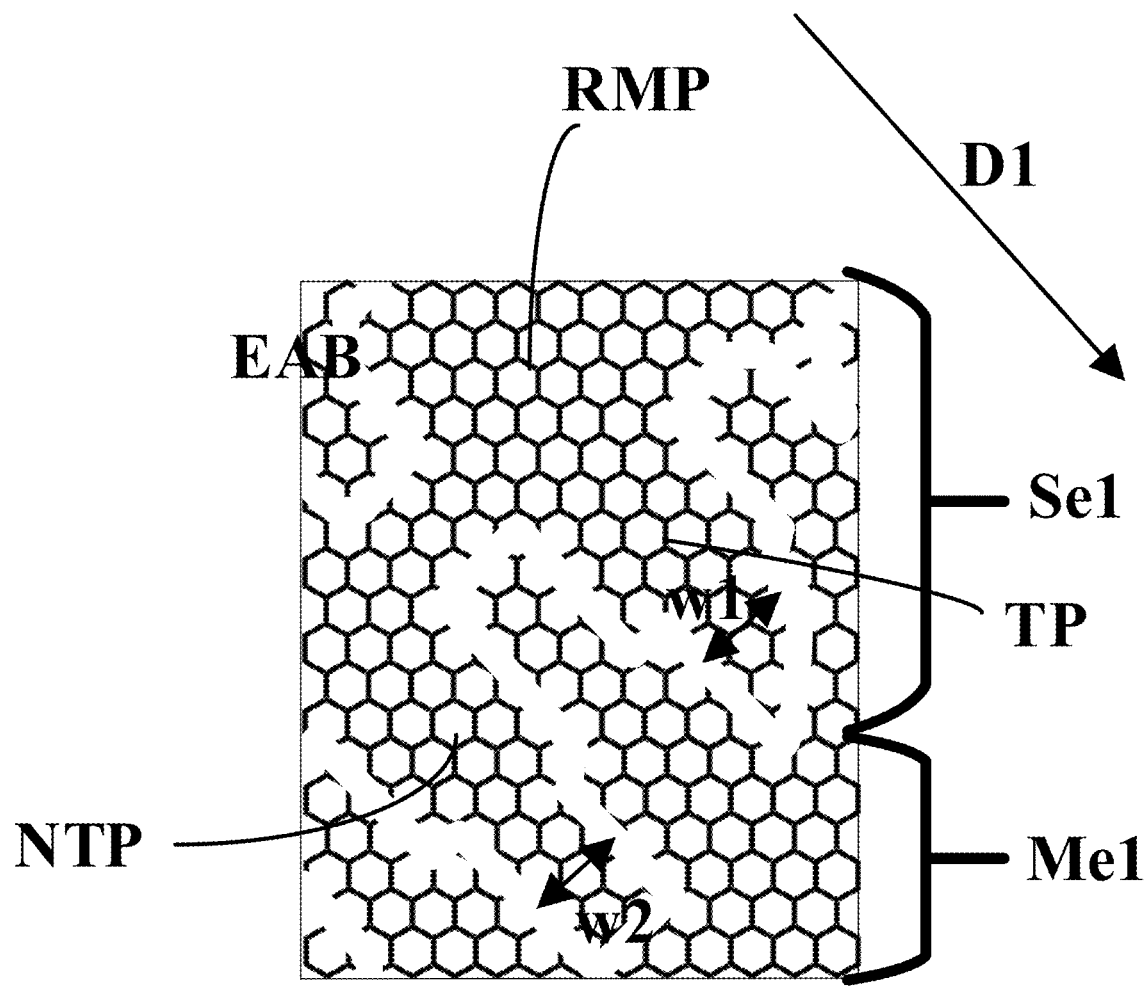
FIG. 15 is a zoom-in view of a fourth zoom-in region in FIG. 14.

FIG. 15 is a zoom-in view of a fourth zoom-in region in FIG. 14. As shown in FIG. 14 and FIG. 15, a respective one of the plurality of edge-adjacent electrode blocks EAB includes a respective main portion RMP, a truncated protrusion TP, and multiple non-truncated protrusions NTP. At least several multiple non-truncated protrusions NTP have a substantially same shape and dimension, particularly non-truncated protrusions along a side of the respective main portion RMP and not at a corner of the main portion of the respective main portion RMP. Optionally, the truncated protrusion TP is also along a side of the main portion.

The truncated protrusion TP extends from a respective main portion RMP of the respective one of the plurality of edge-adjacent electrode blocks EAB along a first direction D1. Respective ones of the multiple non-truncated protrusions NTP along a same side of the respective main portion RMP as the truncated protrusion TP also respectively extend from the respective main portion RMP along the first direction D1.

Figure 16:
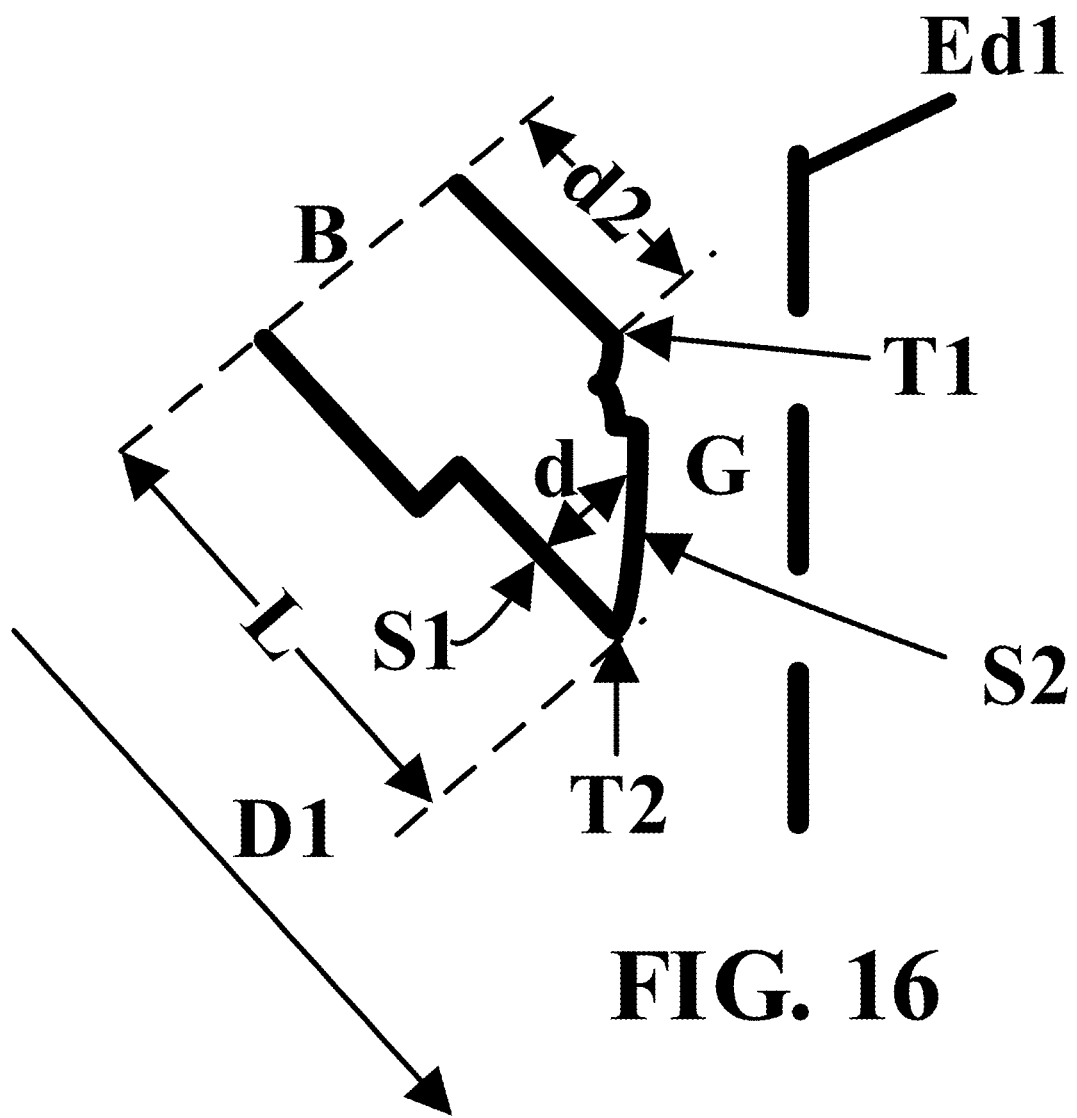
FIG. 16 is a schematic diagram illustrating a truncated protrusion in some embodiments according to the present disclosure.

FIG. 16 is a schematic diagram illustrating a truncated protrusion in some embodiments according to the present disclosure. Referring to FIG. 14 to FIG. 16, in some embodiments, an edge of the truncated protrusion TP is spaced apart from the first edge Ed1 by a gap G. A gap part GP of the first side edge portion Se1 is in the gap G.

In some embodiments, an average width w1 of the truncated protrusion TP along a direction perpendicular to the first direction D1 is less than an average width w2 of a respective one of the multiple non-truncated protrusions NTP along the direction perpendicular to the first direction D1. Optionally, a width of the truncated protrusion TP gradually decrease along the first direction D1.

In some embodiments, referring to FIG. 16, the truncated protrusion has a first side S1 and a second side S2. The second side S2 is closer to the first edge Ed1 than the first side S1. The first side S1 extends along the first direction D1. The second side S2 has a quasi-arch shape. A distance d1 between the first side S1 and the second side S2 gradually decreases along the first direction D1. The quasi-arch shape of the second side S2 has a first terminal T1 and a second terminal T2. The second terminal T2 connects with a terminal of the first side S1. A distance d2 along the first direction D1 between the first terminal T1 and a boundary B between the truncated protrusion TP and the respective main portion RMP is 30% to 70% of a length L of the truncated protrusion TP along the first direction D1.

In some embodiments, the plurality of first touch electrodes TE1 and the plurality of second touch electrodes TE2 are a plurality of first mesh electrodes and a plurality of second mesh electrodes. Mesh electrodes includes mesh lines typically have a line width in a range of 1 μm to 50 μm. Thus, connecting adjacent mesh blocks through the mesh lines is particularly difficult, and often resulting in poor connectivity. The present disclosure adopts a novel and advantageous touch electrode design that obviate issues in related touch control structures. Optionally, the mesh lines have a line width in a range of 1 μm to 5 μm, e.g., 1 μm to 2 μm, 2 μm to 3 μm, 3 μm to 4 μm, or 4 μm to 5 μm. Optionally, the mesh lines have a line width of 3 μm. Referring to FIG. 14 and FIG. 15, in some embodiments, the electrode blocks of the plurality of first touch electrodes TE1 and the plurality of second touch electrodes TE2 are respectively hexagonal mesh electrode blocks.

Figure 18:
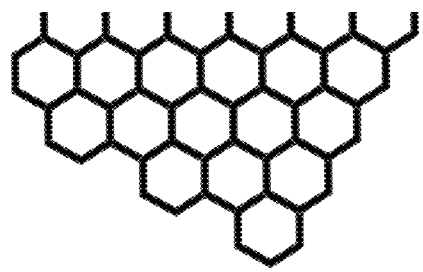
FIG. 18 illustrates mesh line breaks along edges of a truncated portion in some embodiments according to the present disclosure.
Figure 17:
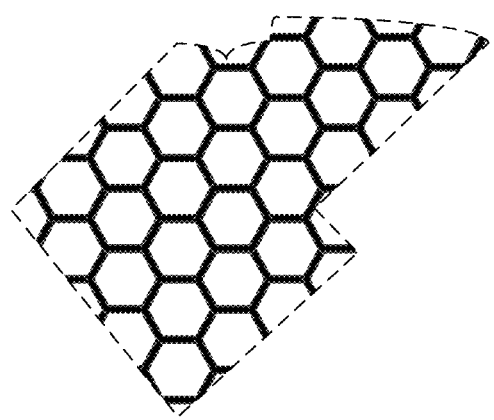
FIG. 17 illustrates mesh line breaks along edges of a truncated portion in some embodiments according to the present disclosure.

In some embodiments, referring to FIG. 14 and FIG. 15, a respective first electrode block and a respective second electrode block adjacent to each other are insulated from each other by line breaks in the mesh lines. FIG. 17 illustrates mesh line breaks along edges of a truncated portion in some embodiments according to the present disclosure. Referring to FIG. 17, the first side S1 and the second side S2 are respectively formed by virtually connected line breaks of the truncated protrusion TP. FIG. 18 illustrates mesh line breaks along edges of a truncated portion in some embodiments according to the present disclosure. Referring to FIG. 18, a respective one of the line breaks is a break in middle of a mesh line. As shown in FIG. 14 to FIG. 16, the gap G is between the first main edge portion Me1 and a protrusion of the first edge electrode block EB1. The gap part GP of the first side edge portion Se1 is in the gap G includes at least one hexagonal mesh.

Figure 20:
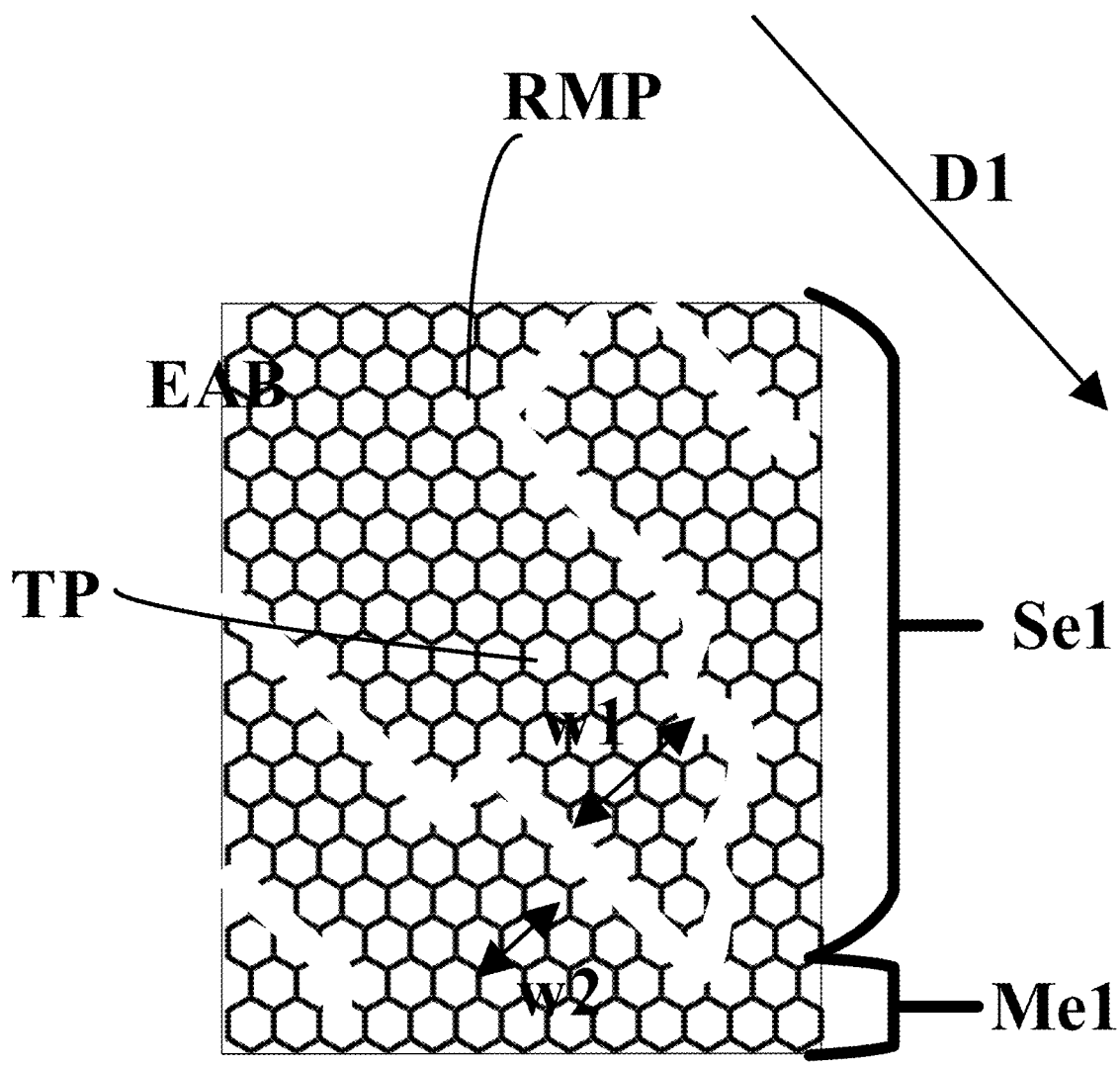
FIG. 20 is a zoom-in view of a fourth zoom-in region in FIG. 14.
Figure 21:
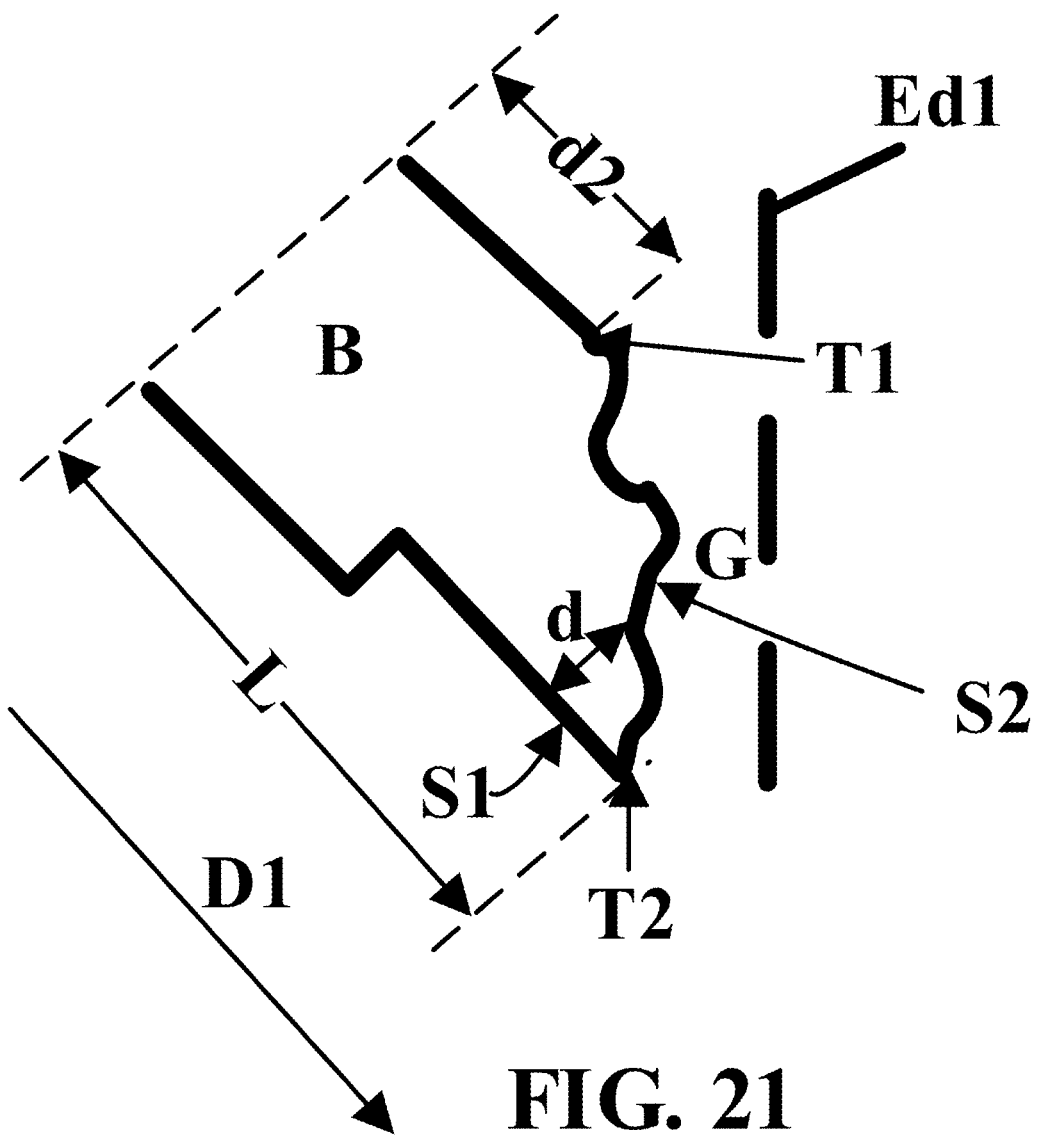
FIG. 21 is a schematic diagram illustrating a truncated protrusion in some embodiments according to the present disclosure.
Figure 22:
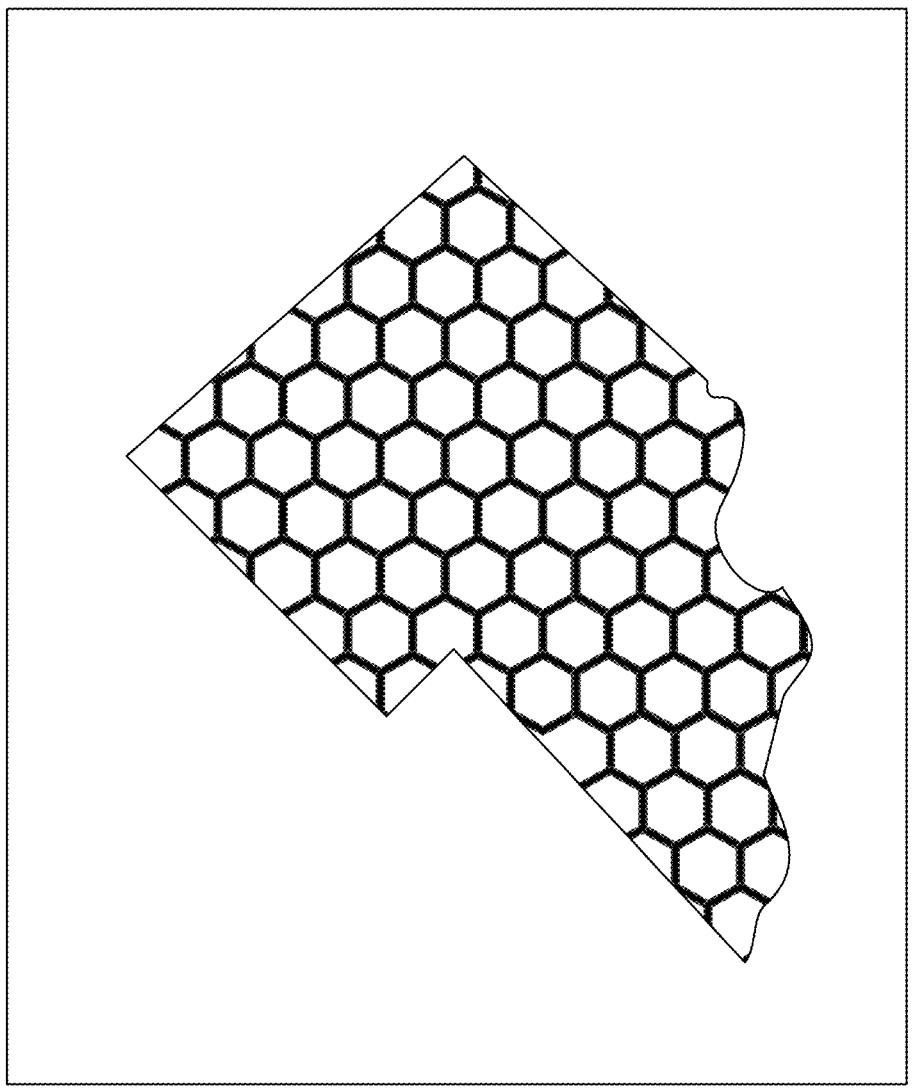
FIG. 22 illustrates mesh line breaks along edges of a truncated portion in some embodiments according to the present disclosure.

FIG. 20 is a zoom-in view of a fourth zoom-in region in FIG. 14. FIG. 21 is a schematic diagram illustrating a truncated protrusion in some embodiments according to the present disclosure. FIG. 22 illustrates mesh line breaks along edges of a truncated portion in some embodiments according to the present disclosure. Referring to FIG. 20 to FIG. 22, in some embodiments, the truncated protrusion has a first side S1 and a second side S2. The second side S2 is closer to the first edge Ed1 than the first side S1. The first side S1 extends along the first direction D1. The second side S2 has an undulating shape. A distance d1 between the first side S1 and the second side S2 gradually decreases along the first direction D1. The undulating shape of the second side S2 has a first terminal T1 and a second terminal T2. The second terminal T2 connects with a terminal of the first side S1. A distance d2 along the first direction D1 between the first terminal T1 and a boundary B between the truncated protrusion TP and the respective main portion RMP is 30% to 70% of a length L of the truncated protrusion TP along the first direction D1.

Referring to FIG. 15 to FIG. 17, and FIG. 20 to FIG. 22, the truncated protrusion has a first side S1 and a second side S2. The second side S2 is closer to the first edge Ed1 than the first side S1. The first side S1 extends along the first direction D1. The second side S2 is a curved side. A distance d1 between the first side S1 and the second side S2 gradually decreases along the first direction D1. The curved side has a first terminal T1 and a second terminal T2. The second terminal T2 connects with a terminal of the first side S1. A distance d2 along the first direction D1 between the first terminal T1 and a boundary B between the truncated protrusion TP and the respective main portion RMP is 30% to 70% of a length L of the truncated protrusion TP along the first direction D1.

Figure 19:
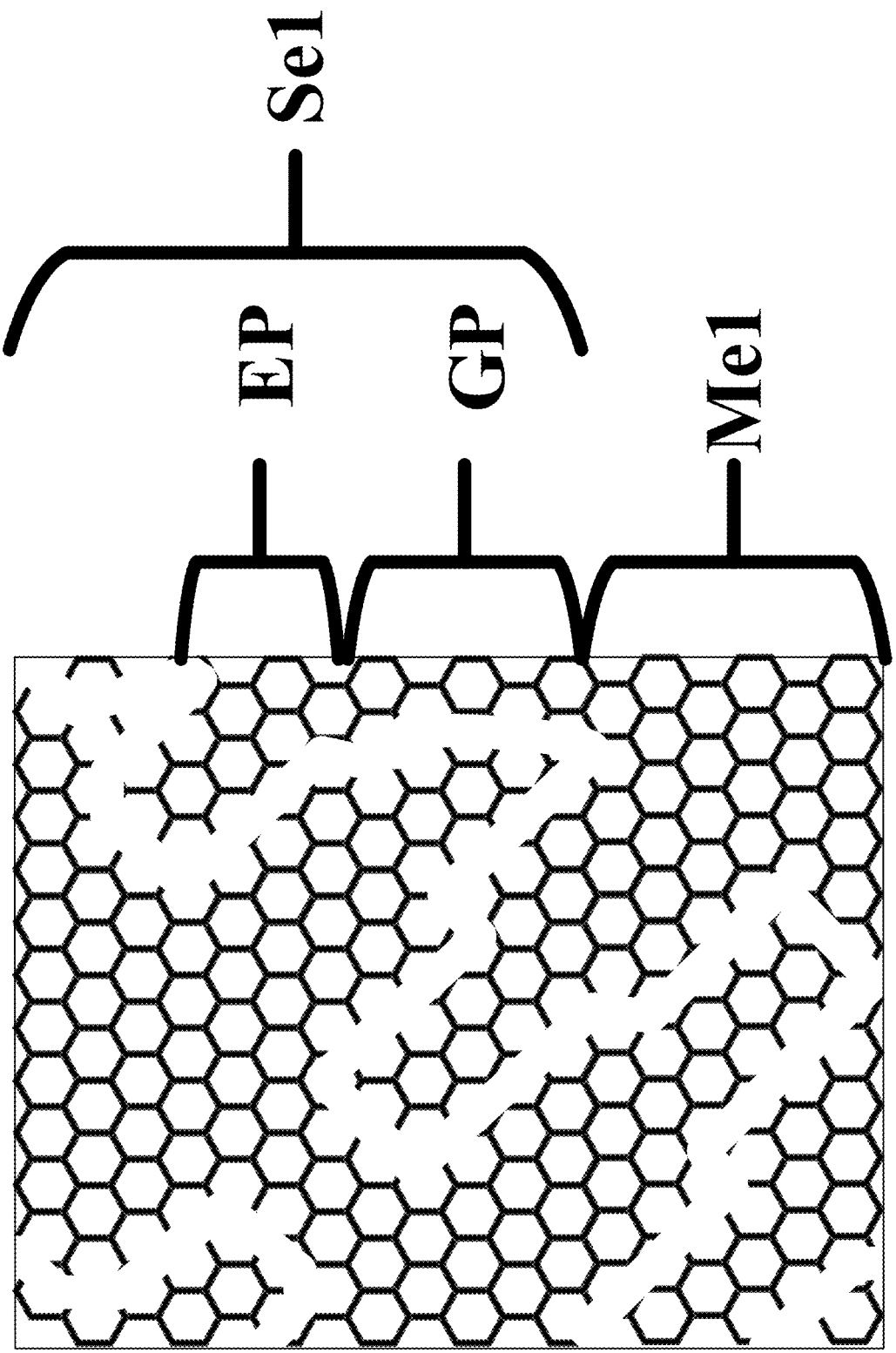
FIG. 19 illustrates a first edge electrode block in some embodiments according to the present disclosure.

FIG. 19 illustrates a first edge electrode block in some embodiments according to the present disclosure. Referring to FIG. 19 and FIG. 16, the gap part GP of the first side edge portion Se1 in the gap G is between the first main edge portion Me1 and an edge protrusion EP of the first edge electrode block EB1, and electrically connected to the first main edge portion Me1 and the edge protrusion EP of the first edge electrode block EB1.

In some embodiments, and referring to FIG. 1 and FIG. 14, second electrode blocks of the plurality of non-edge columns Cne and first electrode blocks other than the multiple first edge electrode blocks respectively from the plurality of rows of the plurality of first touch electrodes TE1 have a substantially same shape and dimension. Optionally, the average width w1 of the truncated protrusion TP is less than an average width of any one of protrusions in the second electrode blocks of the plurality of non-edge columns or in the first electrode blocks other than the multiple first edge electrode blocks respectively from the plurality of rows of the plurality of first touch electrodes, for example, less than w3 in FIG. 14.

In another aspect, the present disclosure provides a display panel including the touch control structure described herein or fabricated by a method described herein, a plurality of display elements, and a plurality of thin film transistors for driving the plurality of display elements. Optionally, the display elements includes a plurality of light emitting diodes, for example, in an organic light emitting diode display panel. Optionally, the display elements include a liquid crystal layer in a plurality of subpixels, for example, in a liquid crystal display panel.

Figure 23A:
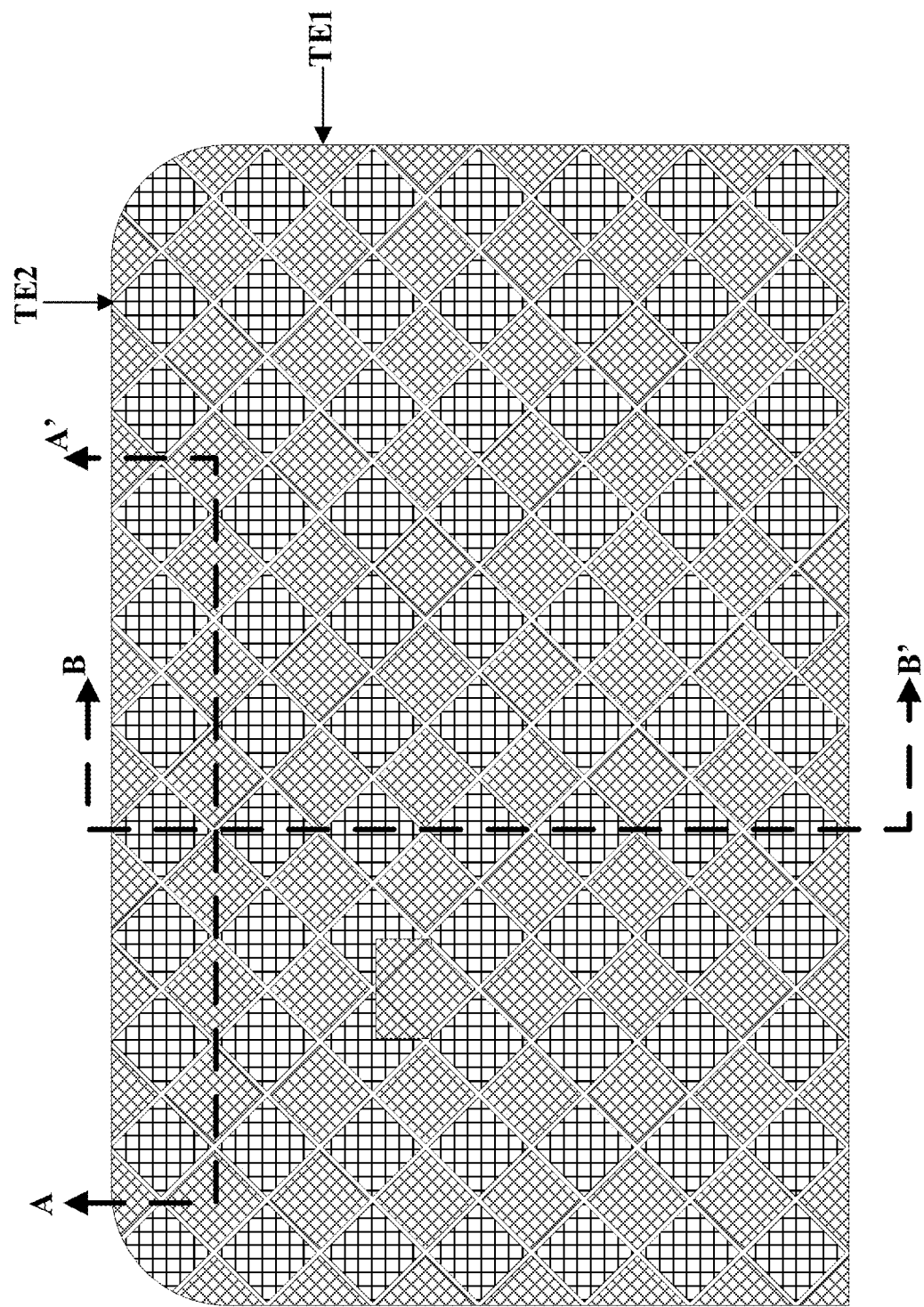
FIG. 23A is a plan view of a display panel in some embodiments according to the present disclosure.

FIG. 23A is a plan view of a display panel in some embodiments according to the present disclosure. FIG. 23B is a cross-sectional view along an A-A' line in FIG. 23A. FIG. 23C is a cross-sectional view along a B-B' line in FIG. 23A. Referring to FIGS. 23A to 23C, the display panel in some embodiments includes an array substrate AS and a counter substrate CS assembled together. In some embodiments, the display panel includes display elements and thin film transistors. Optionally, the display elements includes a plurality of light emitting diodes, for example, in an organic light emitting diode display panel. Optionally, the display elements include a liquid crystal layer in a plurality of subpixels, for example, in a liquid crystal display panel. Referring to FIGS. 23B to 23C, in some embodiments, the array substrate AS includes a base substrate BS, a plurality of thin film transistors TFT on the base substrate BS, and a plurality of light emitting elements LE on the base substrate BS and respectively connected to the plurality of thin film transistors TFT.

In some embodiments, the array substrate AS further includes an encapsulating layer EN encapsulating the plurality of light emitting elements LE. In some embodiments, the counter substrate CS includes a buffer layer BUF and a touch insulating layer TI on the buffer layer BUF. The touch control structure further includes a plurality of touch electrode bridges EB. The touch insulating layer TI is between the plurality of touch electrode bridges EB, and the electrode blocks of the plurality of first touch electrodes TE1 and the plurality of second touch electrodes TE2. The plurality of touch electrode bridges EB respectively extend through vias Vb in the touch insulating layer TI to respectively connect adjacent second electrode blocks in a respective column of the plurality of column of the plurality of second touch electrodes TE2.

Figure 24:
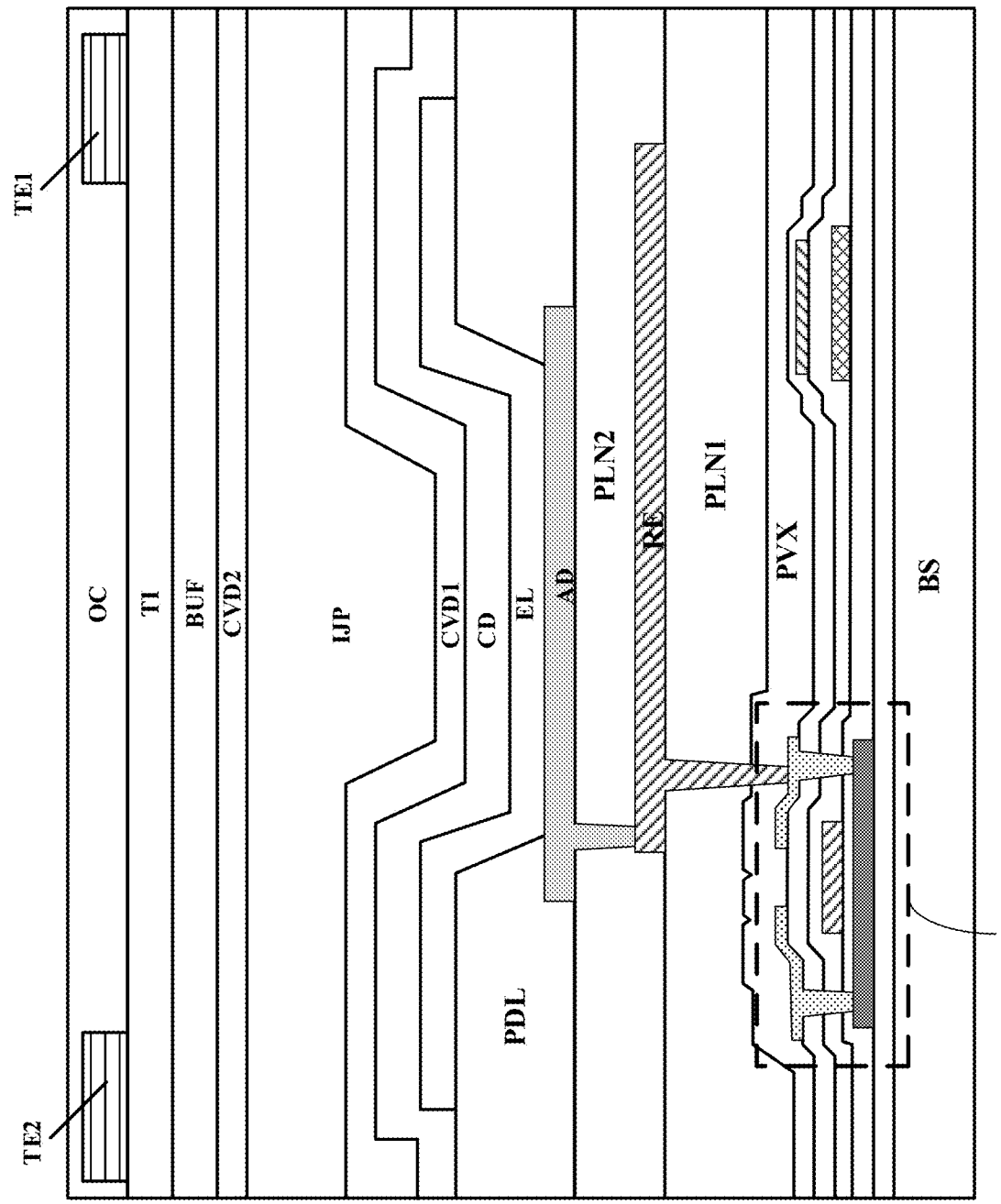
FIG. 24 is a cross sectional view of a display panel in some embodiments according to the present disclosure.

FIG. 24 is a cross sectional view of a display panel in some embodiments according to the present disclosure. Referring to FIG. 24, in the display region, the display panel includes a base substrate BS, a plurality of thin film transistors TFT on the base substrate BS, a passivation layer PVX on a side of the plurality of thin film transistors TFT away from the base substrate BS, a first planarization layer PLN1 on side of the passivation layer PVX away from the base substrate BS, a relay electrode RE on side of the first planarization layer PLN1 away from the passivation layer PVX, a second planarization layer PLN2 on a side of the relay electrode RE away from the first planarization layer PLN1, a pixel definition layer PDL on a side of the second planarization layer PLN2 away from the first planarization layer PLN1 and defining subpixel apertures, an anode AD on a side of the second planarization layer PLN2 away from the first planarization layer PLN1, a light emitting layer EL on a side of the anode AD away from the second planarization layer PLN2, a cathode CD on a side of the light emitting layer EL away from the anode AD, a first inorganic encapsulating layer CVD1 on a side of the cathode CD away from light emitting layer EL, an organic encapsulating layer IJP on a side of the first inorganic encapsulating layer CVD1 away from the cathode CD, a second inorganic encapsulating layer CVD2 on a side of the organic encapsulating layer IJP away from the first inorganic encapsulating layer CVD1, a buffer layer BUF on a side of the second inorganic encapsulating layer CVD2 away from the organic encapsulating layer IJP, a touch insulating layer TI on a side of the buffer layer BUF away from the second inorganic encapsulating layer CVD2, touch electrodes (e.g., the plurality of first touch electrodes TE1 and the plurality of second touch electrodes TE2 as shown in FIG. 24) on a side of the touch insulating layer TI away from the buffer layer BUF, and an overcoat layer OC on a side of the touch electrodes away from the touch insulating layer TI.

In another aspect, the present disclosure provides a display apparatus including a display panel described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present disclosure provides a method of fabricating a touch control structure. In some embodiments, the method includes forming a plurality of first touch electrodes arranged in a plurality of rows and a plurality of second touch electrodes arranged in a plurality of columns. Optionally, the plurality of rows of the plurality of first touch electrodes respectively extend to a first edge of the touch control structure. Optionally, forming a respective row of the plurality of rows includes forming a plurality of non-edge first electrode blocks and forming a first edge electrode block, the first edge electrode block being formed along the first edge. Optionally, the plurality of non-edge first electrode blocks have a same shape. Optionally, the first edge electrode block comprises a first main edge portion and a first side edge portion respectively along the first edge. Optionally, a respective one of plurality of non-edge first electrode blocks comprises a first main portion and a first side portion respectively along a first virtual line parallel to the first edge. Optionally, along the first virtual line, boundaries of the first main portion and the first side portion are disconnected from each other. Optionally, the first main edge portion and the first side edge portion are directly physically connected to each other. Optionally, the first main edge portion and the first main portion have a same shape. Optionally, external electrode edges of the first main edge portion other than a portion along the first edge are identical to external electrode edges of the first main portion. Optionally, the first side edge portion and the first side portion have at least partially different shapes and at least partially different external contours.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A touch control structure, comprising a plurality of first touch electrodes arranged in a plurality of rows and a plurality of second touch electrodes arranged in a plurality of columns;
   wherein the plurality of rows of the plurality of first touch electrodes respectively extend to a first edge of the touch control structure;
   a respective row of the plurality of rows comprises a plurality of non-edge first electrode blocks and a first edge electrode block, the first edge electrode block being along the first edge;
   the plurality of non-edge first electrode blocks have a same shape;
   electrode blocks of the plurality of first touch electrodes and the plurality of second touch electrodes are in a same layer, and respectively comprises a main portion and protrusion portions;
   the plurality of column of the plurality of second touch electrodes comprise a plurality of non-edge columns and an edge-adjacent column, the edge-adjacent column being directly adjacent to multiple first edge electrode blocks respectively from the plurality of rows of the plurality of first touch electrodes;
   the edge-adjacent column comprises a plurality of edge-adjacent electrode blocks electrically connected;
   a respective one of the plurality of edge-adjacent electrode blocks comprises a truncated protrusion, and multiple non-truncated protrusions;
   an edge of the truncated protrusion is spaced apart from the first edge by a gap;
   a gap part of the first edge electrode block is in the gap;
   the truncated protrusion extends from a respective main portion of the respective one of the plurality of edge-adjacent electrode blocks along a first direction; and
   an area of the truncated protrusion is less than an area of a respective non-truncated protrusion of the multiple non-truncated protrusions.

2. The touch control structure of claim 1, wherein an average width of the truncated protrusion along a direction perpendicular to the first direction is less than an average width of the respective non-truncated protrusion along the direction perpendicular to the first direction.

3. The touch control structure of claim 1, wherein a length of the truncated protrusion along the first direction is less than a length of the respective non-truncated protrusion along the first direction.

4. The touch control structure of claim 1, wherein a width along a direction perpendicular to the first direction of at least a portion of the truncated protrusion gradually decrease along the first direction.

5. The touch control structure of claim 1, wherein the truncated protrusion has a first side and a second side;
   the second side is closer to the first edge than the first side;
   the first side extends along the first direction;
   the first side and the second side cross over each other, forming an included angle less than 90 degrees; and
   a distance between the first side and the second side gradually decreases along the first direction.

6. The touch control structure of claim 5, wherein the second side is a curved side having a first terminal and a second terminal;
   the second terminal connects with a terminal of the first side;

a distance along the first direction between the first terminal and a boundary between the truncated protrusion and the respective main portion is 30% to 70% of a length of the truncated protrusion along the first direction.

7. The touch control structure of claim 5, wherein the electrode blocks of the plurality of first touch electrodes and the plurality of second touch electrodes are respectively hexagonal mesh electrode blocks;
   a respective first electrode block and a respective second electrode block adjacent to each other are insulated from each other by line breaks in mesh lines;
   the first side and the second side are respectively formed by virtually connected line breaks of the truncated protrusion.

8. The touch control structure of claim 5, wherein a respective one of the line breaks is a break in middle of a mesh line.

9. The touch control structure of claim 1, wherein the gap part in the gap comprises at least one mesh along a row direction.

10. The touch control structure of claim 1, wherein the first edge electrode block comprises a first main edge portion and a first side edge portion respectively along the first edge; and
   the gap part of the first side edge portion in the gap is between the first main edge portion and an edge protrusion of the first edge electrode block, and electrically connected to the first main edge portion and the edge protrusion of the first edge electrode block.

11. The touch control structure of claim 1, wherein second electrode blocks of the plurality of non-edge columns and first electrode blocks other than the multiple first edge electrode blocks respectively from the plurality of rows of the plurality of first touch electrodes have a substantially same shape and dimension; and
   the average width of the truncated protrusion is less than an average width of any one of protrusions in the second electrode blocks of the plurality of non-edge columns or in the first electrode blocks other than the multiple first edge electrode blocks respectively from the plurality of rows of the plurality of first touch electrodes.

12. The touch control structure of claim 1, further comprising a plurality of touch electrode bridges and an insulating layer between the plurality of touch electrode bridges, and the electrode blocks of the plurality of first touch electrodes and the plurality of second touch electrodes;
   the plurality of touch electrode bridges respectively extend through vias in the insulating layer to respectively connect adjacent second electrode blocks in a respective column of the plurality of columns of the plurality of second touch electrodes.

13. The touch control structure of claim 1, wherein a respective one of plurality of non-edge first electrode blocks comprises a first main portion and a first side portion respectively along a first virtual line parallel to the first edge;
   along the first virtual line, boundaries of the first main portion and the first side portion are disconnected from each other;
   the first edge electrode block comprises a first main edge portion and a first side edge portion respectively along the first edge;
   the first main edge portion and the first side edge portion are directly physically connected to each other;
   the first main edge portion and the first main portion have a same shape;
   external electrode edges of the first main edge portion other than a portion along the first edge are identical to external electrode edges of the first main portion; and
   the first side edge portion and the first side portion have at least partially different shapes and at least partially different external contours.

14. The touch control structure of claim 13, wherein the first side edge portion comprises a first outer sub-portion and a first bridge sub-portion respectively along the first edge, the first bridge sub-portion directly physically connecting the first outer sub-portion to the first main edge portion;
   the first side portion comprises a first sub-portion and a second sub-portion along the first virtual line;
   external electrode edges of the first outer sub-portion other than a portion along the first edge are identical to external electrode edges of the first sub-portion;
   the first sub-portion and the first outer sub-portion have a same shape;
   the first bridge sub-portion and the second sub-portion have different shapes and different external contours; and
   along the first virtual line, boundaries of the second sub-portion and the first main portion are disconnected from each other.

15. The touch control structure of claim 14, wherein the first main portion and the first main edge portion have a first translational symmetry;
   the first outer sub-portion and the first sub-portion have a second translational symmetry; and
   the first translational symmetry and the second translational symmetry are the same.

16. The touch control structure of claim 13, wherein the first side portion is at least a portion of a protrusion of the respective one of the plurality of non-edge first electrode blocks; and
   the first side edge portion is a protrusion of the first edge electrode block.

17. The touch control structure of claim 13, wherein the first edge electrode block further comprises a second side edge portion;
   the first side edge portion, the first main edge portion, and second side edge portion are sequentially arranged along the first edge;
   the respective one of the plurality of non-edge first electrode blocks further comprises a second side portion;
   the first side portion, the first main portion, and the second side portion are sequentially arranged along the first virtual line;
   along the first virtual line, boundaries of the first main portion and the second side portion are disconnected from each other;
   the first main edge portion and the second side edge portion are directly physically connected to each other; and
   the second side edge portion and the second side portion have at least partially different shapes and at least partially different external contours.

18. The touch control structure of claim 17, wherein the second side edge portion comprises a second outer sub-portion and a second bridge sub-portion respectively along the first edge, the second bridge sub-portion directly physically connecting the second outer sub-portion to the first main edge portion;
   the second side portion comprises a third sub-portion and a fourth sub-portion along the first virtual line;

external electrode edges of the second outer sub-portion other than a portion along the first edge are identical to external electrode edges of the third sub-portion;

the third sub-portion and the second outer sub-portion have a same shape;

the second bridge sub-portion and the fourth sub-portion have different shapes and different external contours; and along the first virtual line, boundaries of the fourth sub-portion and the first main portion are disconnected from each other.

19. The touch control structure of claim 18, wherein the first main portion and the first main edge portion have a first translational symmetry;

the first outer sub-portion and the first sub-portion have a second translational symmetry;

the second outer sub-portion and the third sub-portion have a third translational symmetry; and the first translational symmetry, the second translational symmetry, and the third translational symmetry are the same.

20. A display apparatus, comprising the touch control structure of claim 1, a display panel, and an integrated circuit connected to the display panel.

\* \* \* \* \*